(12) United States Patent
Ishii

(10) Patent No.: US 11,740,259 B1
(45) Date of Patent: Aug. 29, 2023

(54) METHOD OF MANUFACTURING SEMICONDUCTOR DEVICE

(71) Applicant: RENESAS ELECTRONICS CORPORATION, Tokyo (JP)

(72) Inventor: Toshitsugu Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/679,770

(22) Filed: Feb. 24, 2022

(51) Int. Cl.
  *G01R 1/06* (2006.01)
  *G01R 1/067* (2006.01)
  *H01L 21/66* (2006.01)

(52) U.S. Cl.
  CPC .......... *G01R 1/06733* (2013.01); *H01L 22/14* (2013.01)

(58) Field of Classification Search
  CPC ............................ G01R 1/06733; H01L 22/14
  USPC ........................................................ 324/500
  See application file for complete search history.

(56) References Cited

U.S. PATENT DOCUMENTS

| | | | | |
|---|---|---|---|---|
| 6,016,061 A | * | 1/2000 | Mizuta ............... | G01R 1/06738 324/755.07 |
| 9,761,501 B2 | | 9/2017 | Ishii et al. | |
| 2016/0064291 A1 | * | 3/2016 | Ishii ....................... | G01R 31/40 438/15 |
| 2016/0141215 A1 | * | 5/2016 | Ishii .................... | G01R 1/06716 438/15 |

FOREIGN PATENT DOCUMENTS

WO    2014/167693 A1    10/2014

\* cited by examiner

*Primary Examiner* — Jermele M Hollington
*Assistant Examiner* — Courtney G McDonnough
(74) *Attorney, Agent, or Firm* — McDermott Will & Emery LLP

(57) ABSTRACT

An inspection terminal provided in a test device has a main body portion including a support portion that is curved; a plate-shaped portion integrally connected to the support portion and extending in a first direction; a tip portion integrally connected to the plate-shaped portion and having a larger dimension in a second direction intersecting with the first direction than that of the plate-shaped portion in the second direction; and a slit formed from the tip portion to the plate-shaped portion so as not to reach the support portion of the inspection terminal. The tip portion of the inspection terminal has a first contact portion and a second contact portion that are separated from each other by way of via the slit, and each contact portion is brought into contact with an external terminal of a semiconductor package, and an electrical test of the semiconductor package is performed.

14 Claims, 19 Drawing Sheets

METHOD OF MANUFACTURING SEMICONDUCTOR DEVICE

BACKGROUND

The present invention relates to a method of manufacturing a semiconductor device, for example, a technique effectively applicable to a technique for inspecting a semiconductor device by causing an inspection terminal to contact with an external terminal of the semiconductor device.

PCT-international-application Japanese translation No. 2014-167693 discloses that a test step of semiconductor devices is performed by using a socket terminal.

SUMMARY

In a manufacturing process of semiconductor devices, in order to exclude defective products, a test terminal is caused to contact with an external terminal of the semiconductor device, and the semiconductor devices are electrically tested. At this time, if a contact condition between the test terminal and the external terminal of the semiconductor device is not appropriate, reliability of the electrical test may decrease.

Also, when the electrical tests are performed to a large number of semiconductor devices, the test terminals deteriorate. Consequently, after performing the electrical tests to a certain number of semiconductor devices, the deteriorated test terminals need to be replaced. However, frequent replacement of the test terminals becomes a factor in increasing manufacturing cost of the semiconductor devices.

Other problems and novel features will become apparent from descriptions of the present specification and the companying drawings.

According to one embodiment, a method of manufacturing a semiconductor device, includes: (a) preparing a test device having an inspection terminal, (b) preparing a semiconductor package having an external terminal, and (c) bringing, after the step (a) and the step (b), the inspection terminal into contact with the external terminal of the semiconductor package, and performing an electrical test of the semiconductor package. Here, the inspection terminal has: a main body portion including a support portion that is curved; a plate-shaped portion integrally connected to the support portion and extending in a first direction; a tip portion integrally connected to the plate-shaped portion; and a slit formed from the tip portion to the plate-shaped portion so as not to reach the support portion. Also, a dimension of the tip portion in a second direction intersecting with the plate-shaped portion in the second direction. Also, the tip portion has a first contact portion and a second contact portion that are separated from each other by way of the slit. Further, in the step (c), after arranging each of the inspection terminal and the semiconductor package such that the tip portion of the inspection terminal and the external terminal of the semiconductor package are opposed to each other in the second direction, each of the first contact portion and the second contact portion is brought into contact with the external terminal.

DETAILED DESCRIPTION

Figure 1:
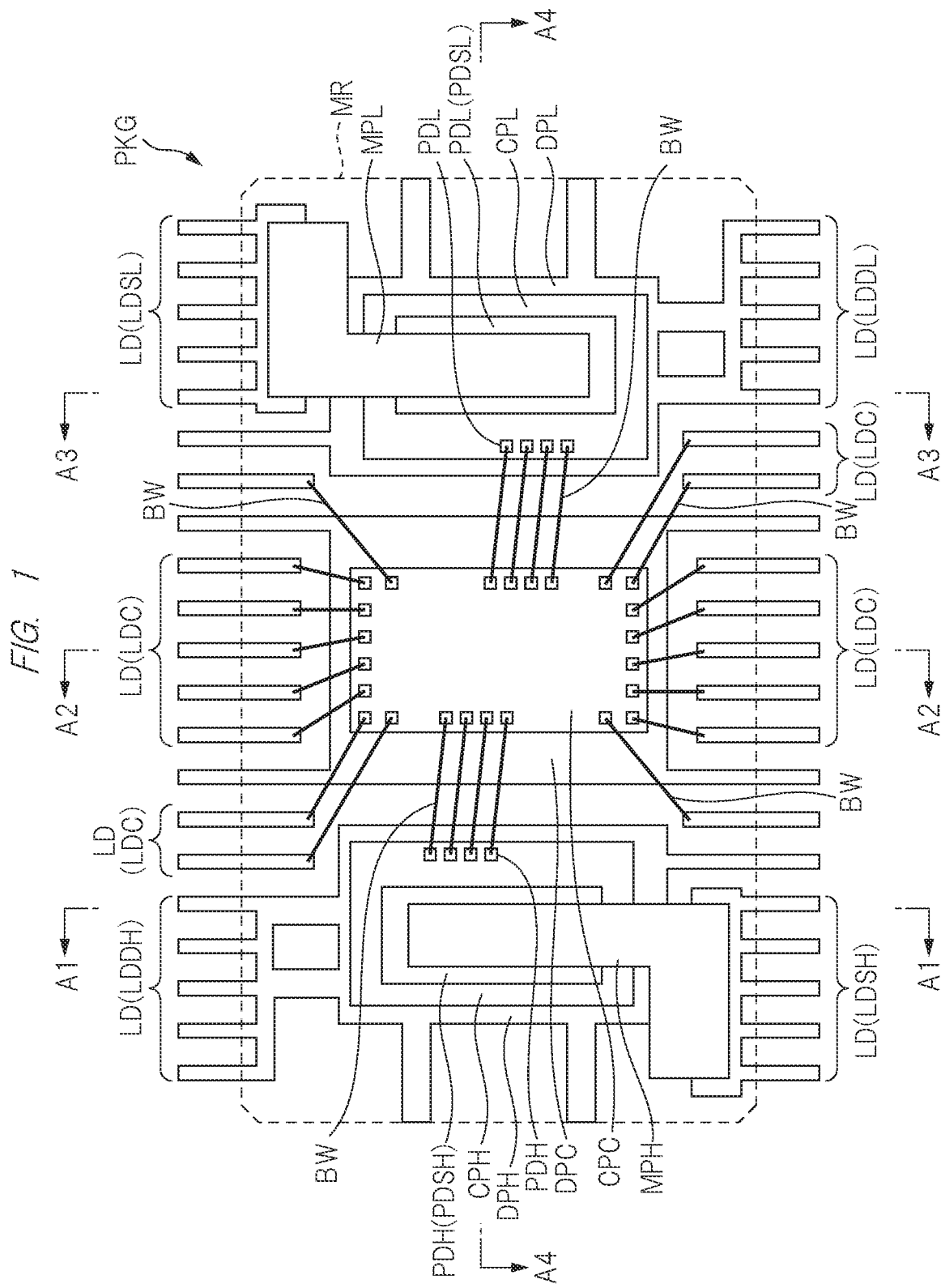
FIG. 1 is a plan perspective view of a semiconductor device of one embodiment.
Figure 2:
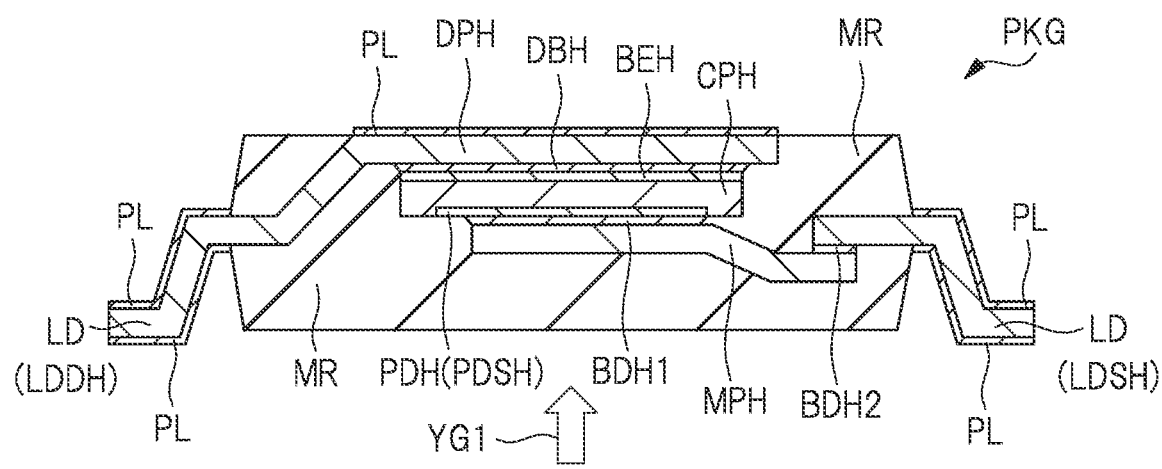
FIG. 2 is a sectional view of the semiconductor device of one embodiment.
Figure 3:
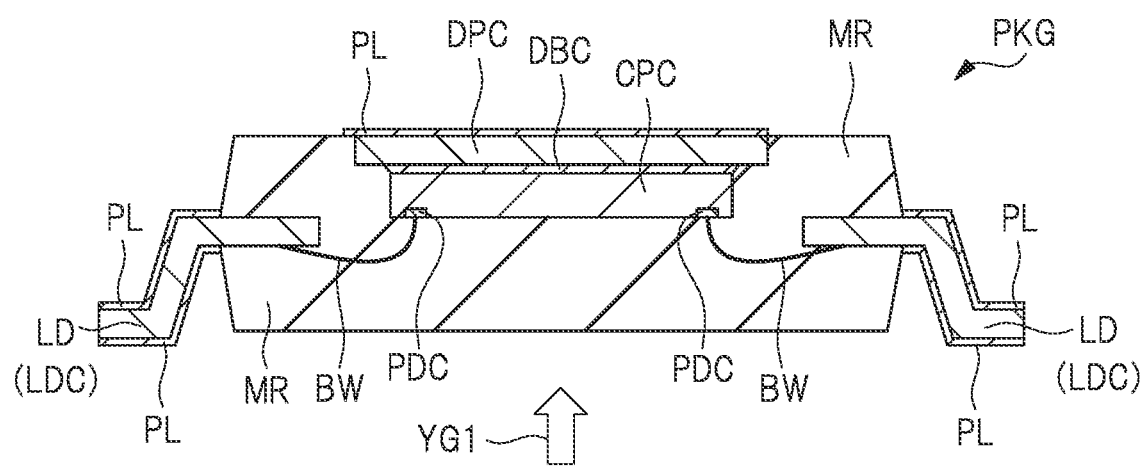
FIG. 3 is a sectional view of the semiconductor device of one embodiment.
Figure 4:
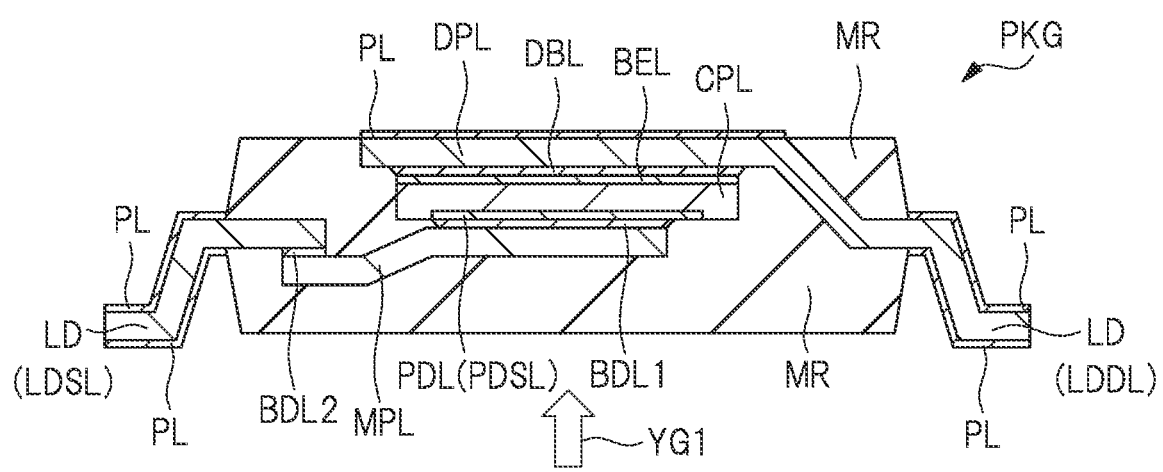
FIG. 4 is a sectional view of the semiconductor device of one embodiment.
Figure 5:
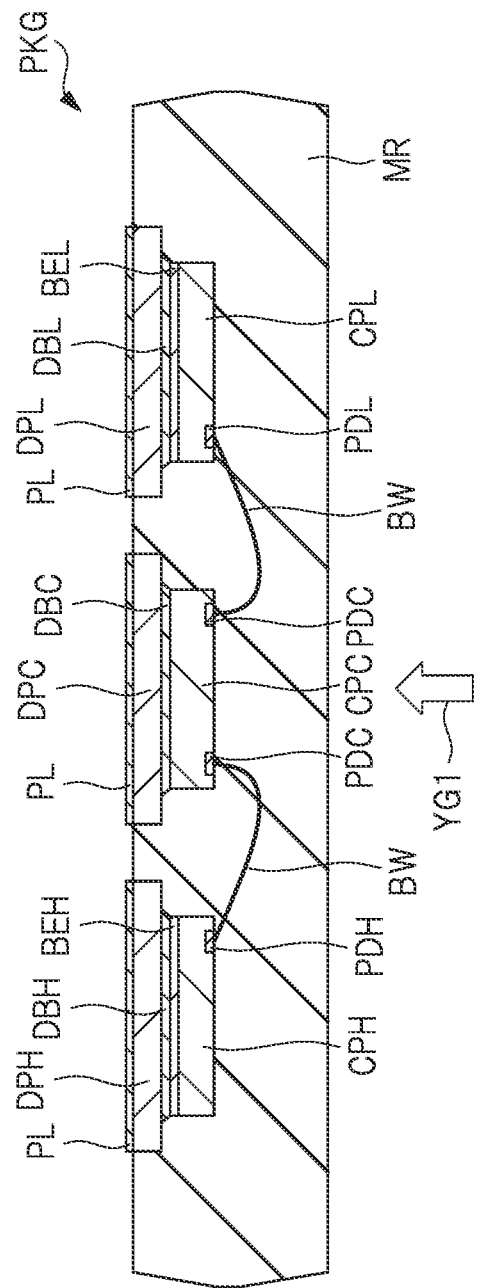
FIG. 5 is a sectional view of the semiconductor device of one embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

First Embodiment

<Semiconductor Device>

First, an example of a semiconductor device of the present embodiment will be described with reference to FIGS. 1 to 5. FIG. 1 is a plan perspective view of a semiconductor device of the present embodiment, and FIGS. 2 to 5 are sectional views of the semiconductor device of the present embodiment. FIG. 1 shows a plan perspective view of seeing through a sealing portion MR when a semiconductor device PKG is viewed from a direction of an arrow YG1 shown in FIGS. 2 to 5. Further, a sectional view of the semiconductor device PKG taken at a position of line A1-A1 in FIG. 1 substantially corresponds to that of FIG. 2, and a sectional view of the semiconductor device PKG taken at a position of line A2-A2 of FIG. 1 is substantially corresponds to that of FIG. 3. A sectional view of the semiconductor device PKG taken at a position of line A3-A3 in FIG. 1 substantially corresponds to that of FIG. 4, and a sectional view of the semiconductor device PKG taken at a position of line A4-A4 in FIG. 1 substantially corresponds to that of FIG. 5.

The semiconductor device PKG of the present embodiment is a semiconductor device in a package form, that is, a semiconductor package. In the present embodiment, a case where a semiconductor device for switching, for example, a semiconductor device constituting an inverter is applied as the semiconductor device PKG will be described as an example.

Specifically, as shown in FIG. 1, the semiconductor device PKG includes: semiconductor chips CPC, CPH, CPL; die pads (chip mounting portion) DPC, DPH, DPL on which the semiconductor chips CPC, CPH, CPL are respectively mounted; a plurality of leads (lead portions) LD formed by conductors; and a sealing portion (sealing resin portion) MR for sealing them.

The sealing portion MR is made of a resin material such as a thermosetting resin material, and can also contain a filler or the like. For example, the sealing portion MR can be formed by using an epoxy resin or the like containing a filler.

The die pads DPC, DPH, DPL and the plurality of leads LD are made of conductors, preferably, are each made of a metal material such as copper (Cu) or a copper alloy.

The semiconductor chip CPH is a semiconductor chip on which a power MOSFET (Metal Oxide Semiconductor Field Effect Transistor) for a high-side switch is formed, and the semiconductor chip CPL is a semiconductor chip on which a power MOSFET for a low-side switch is formed. The semiconductor chip CPC is a semiconductor chip on which a control circuit for controlling the semiconductor chips CPH, CPL is formed.

The semiconductor chip CPC has a plurality of pads (pad electrodes) PDCs on an upper surface side. The semiconductor chip CPH has a plurality of pads (pad electrodes) PDH including a pad (pad electrode) PDSH for a source on an upper surface side, and has a back electrode BEH for a drain on a back surface side. The semiconductor chip CPL has a plurality of pads (pad electrodes) PDL including a pad (pad electrode) PDSL for a source on an upper surface side, and has a back electrode BEL for a drain on a back surface side. The back electrode BEH is an electrode (drain electrode) for a drain of the power MOSFET formed in the semiconductor chip CPH, and the pad PDSH is an electrode (source electrode) for a source of the power MOSFET formed in the semiconductor chip CPH. Further, the back electrode BEL is an electrode (drain electrode) for a drain of the power MOSFET formed in the semiconductor chip CPL, and the pad PDSL is an electrode (source electrode) for a source of the power MOSFET formed in the semiconductor chip CPL.

The semiconductor chip CPH is mounted on the die pad DPH via a conductive bonding material DBH, and the back electrode BEH of the semiconductor chip CPH and the die pad DPH are electrically connected through the conductive bonding material DBH. Since a plurality of leads LDDH among the plurality of leads LD are integrally formed with the die pad DPH, the back electrode BEH of the semiconductor chip CPH is electrically connected to the plurality of leads LDDH. The semiconductor chip CPL is mounted on the die pad DPL via a conductive bonding material DBL, and the back electrode BEL of the semiconductor chip CPL and the die pad DPL are electrically connected through the conductive bonding material DBL. Since a plurality of leads LDDL among the plurality of leads LD are integrally formed with the die pad DPL, the back electrode BEL of the semiconductor chip CPL is electrically connected to the plurality of leads LDDL.

The semiconductor chip CPC is mounted on the die pad DPC via a conductive or insulating bonding DBC.

The pad PDSH for the source of the semiconductor chip CPH is electrically connected to a plurality of leads LDSH among the plurality of leads LD via a metal plate MPH. That is, the metal plate MPH is electrically connected to the pad PDSH via a conductive bonding material BDH1, and is electrically connected to the plurality of leads LDSH via a conductive bonding material BDH2. Further, the pad PDSL for the source of the semiconductor chip CPL is electrically connected to a plurality of leads LDSL among the plurality of leads LD via a metal plate MPL. That is, the metal plate MPL is electrically connected to the pad PDSL via a conductive bonding material BDL1, and is electrically connected to the plurality of leads LDSL via a conductive bonding material BDL2.

The plurality of pads PDC that are parts of the plurality of pads PDC of the semiconductor chip CPC are electrically connected to the plurality of pads PDH other than the pad PDSH in the semiconductor chip CPH via a plurality of conductive wires BW, respectively. The plurality of pads PDC that are other parts of the plurality of pads PDC of the semiconductor chip CPC are electrically connected to the plurality of pads PDL other than the pad PDSL in the semiconductor chip CPL via the plurality of conductive wires BW, respectively. The plurality of pads PDC that are yet other parts of the plurality of pads PDC of the semiconductor chip CPC are electrically connected to the plurality of leads LDC among the plurality of leads LD via the plurality of conductive wires BW.

When the semiconductor device PKG is mounted on a wiring board (not shown) or the like, the plurality of leads LDDH of the semiconductor device PKG and the plurality of leads LDSL of the semiconductor device PKG are electrically connected through a wiring(s) of the wiring board. In that state, the pad PDSL for the source of the semiconductor chip CPL and the back electrode BEH for the drain of the semiconductor chip CPH are electrically connected via the die pad DPH, the plurality of leads LDDH, the wiring of the wiring board, the plurality of leads LDSL, and the metal plate MPL.

A part of each of the plurality of leads LD is exposed from the sealing portion MR, and the other part is sealed in the sealing portion MR. Here, a part (outer lead portion) of each lead LD projects from a side surface of the sealing portion MR to an outside of the sealing portion MR. The outer lead portion of each lead LD is bent and processed so that a lower surface in the vicinity of an end portion of the outer lead portion is located on substantially the same plane as a back surface of the sealing portion MR. Incidentally, a portion of the lead LD located inside the sealing portion MR is referred to as an inner lead portion, and a portion of the lead LD located outside the sealing portion MR is referred to as an outer lead portion.

Incidentally, the semiconductor device PKG of the present embodiment has a structure in which a part (outer lead portion) of each lead LD protrudes from the side surface of the sealing portion MR, and will be described below based on this structure. However, the present invention is not limited to this structure and can also adopt, for example, such a configuration or the like that each lead LD hardly protrudes from the side surface of the sealing portion MR, and a part of each lead LD is exposed on the back surface of the sealing portion MR (QFN type configuration).

An exposed portion (here, the outer lead portion of each lead LD) of each lead LD from the sealing portion MR can be regarded as an external terminal (external connection terminal portion) of the semiconductor device PKG. Further, a plating layer PL may be formed on the exposed portion (here, the outer lead portion of each lead LD) of each lead LD from the sealing portion MR and, as the plating layer PL, a solder plating layer such as Sn based solder, Sn—Bi based solder, Sn—Ag—Cu based solder can be used. Since the plating layer PL formed on the exposed portion of each lead LD from the sealing portion MR can also be regarded as a part of the lead LD, a combination of the exposed portion of each lead LD from the sealing portion MR and the plating layer PL formed on the exposed portion can be regarded as an external terminal of the semiconductor device PKG.

Further, the lower surfaces of the die pads DPC, DPH, DPL are also exposed on the back surface of the sealing portion MR. The plating layer PL can also be formed on the exposed portion of each die pad DPC, DPH, DPL from the sealing portion MR. The semiconductor chips CPC, CPH, CPL, the metal plates MPH, MPL and the plurality of wires BW are sealed in the sealing portion MR and are not exposed from the sealing portion MR.

<Manufacturing Process of Semiconductor Device>

A manufacturing process of the semiconductor device of the present embodiment includes a step of preparing a test device TS described later, a step of preparing the semiconductor device (inspected object) PKG shown in FIG. 1, and a step (test step) of performing an electrical test to the semiconductor device PKG after those steps.

The step of preparing the semiconductor device PKG includes a die bonding step, a metal plate bonding step, a wire bonding step, a molding step, and a cutting step. Here, in the die bonding step, the semiconductor chips CPC, CPH, CPL are mounted on the die pads DPC, DPH, DPL of the lead frame via the bonding materials (die bonding materials) DBH, DBL, DBC, respectively. In the metal plate bonding step, the metal plate MPH is joined to the pad PDSH of the semiconductor chip CPH via the conductive bonding material BDH1 and to the plurality of leads LDSH via the conductive bonding material BDH2, thereby electrically connecting the pad PDSH for the source of the semiconductor chip CPH and the plurality of leads LDSH via the metal plate MPH. Further, the metal plate MPL is jointed to the pad PDSL of the semiconductor chip CPL via the conductive bonding material BDL1 and to the plurality of leads LDSL via the conductive bonding material BDL2, thereby electrically connecting the pad PDSL for the source of the semiconductor chip CPL and the plurality of leads LDSL via the metal plate MPL. In the wire bonding step, the plurality of pads PDC of the semiconductor chip CPC are electrically connected via the plurality of pads PDH of the semiconductor chip CPH, the plurality of pads PDL of the semiconductor chip CPL, or the plurality of leads LDC via the plurality of wires BW, respectively. In the molding step, the semiconductor chips CPC, CPH, CPL, the die pads DPC, DPH, DPL, the metal plates MPH, MPL, the plurality of wires BW, and the plurality of leads LD are sealed by the sealing portion MR. In the cutting step, the plurality of leads LD are cut from the lead frame. After that, a forming step of the plating layer PL and a bending and processing step of the lead LD are performed as necessary.

In the step (inspection step) of performing the electrical test to the semiconductor device PKG, as described below, the test device TS is used to perform the electrical test to the semiconductor device PKG. This step is called an electrical test step or a test step.

<About Test Device>

Figure 6:
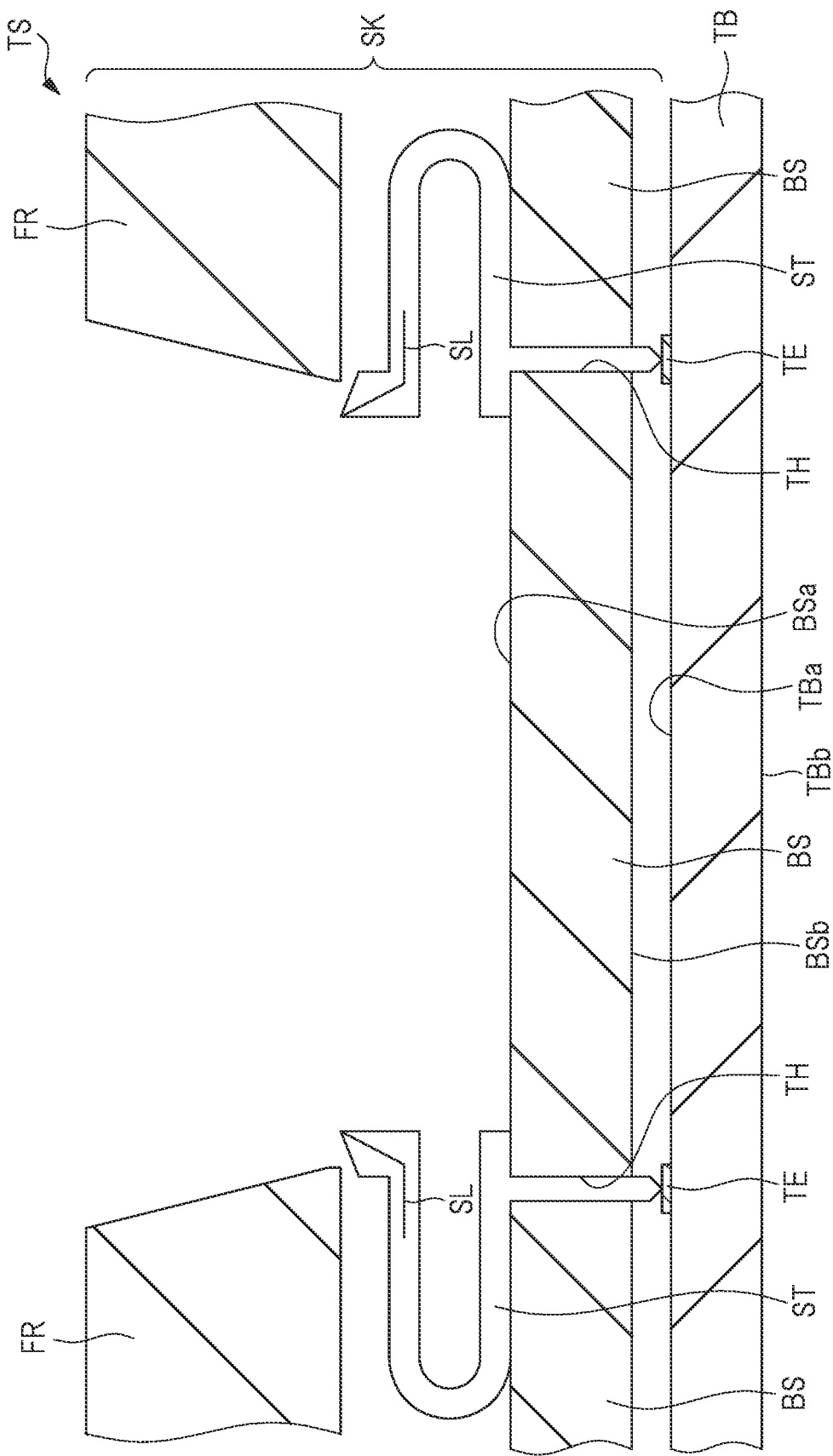
FIG. 6 is an explanatory diagram showing a part of a test device of one embodiment.
Figure 7:
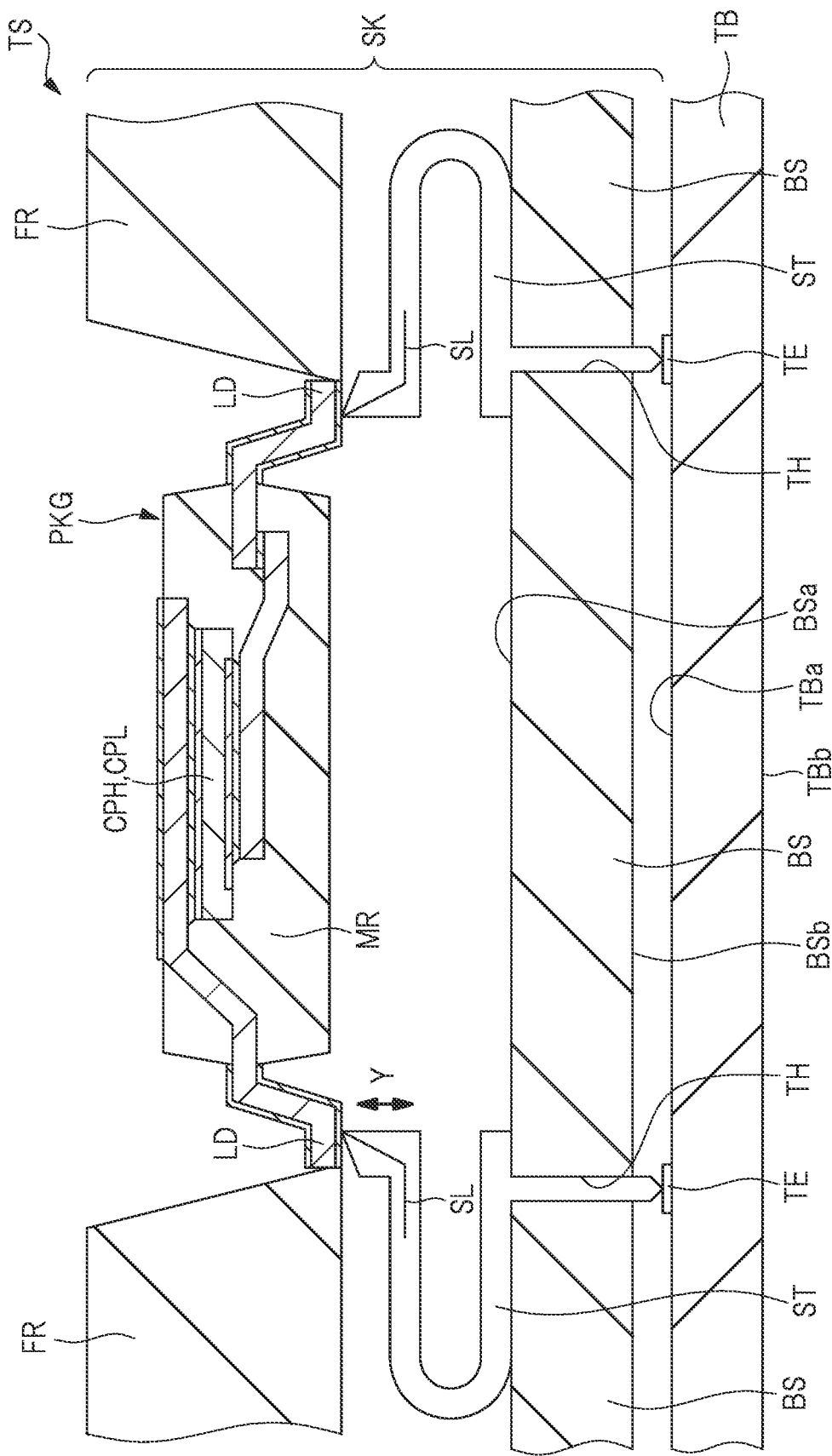
FIG. 7 is an explanatory diagram showing a test step of the semiconductor device.
Figure 8:
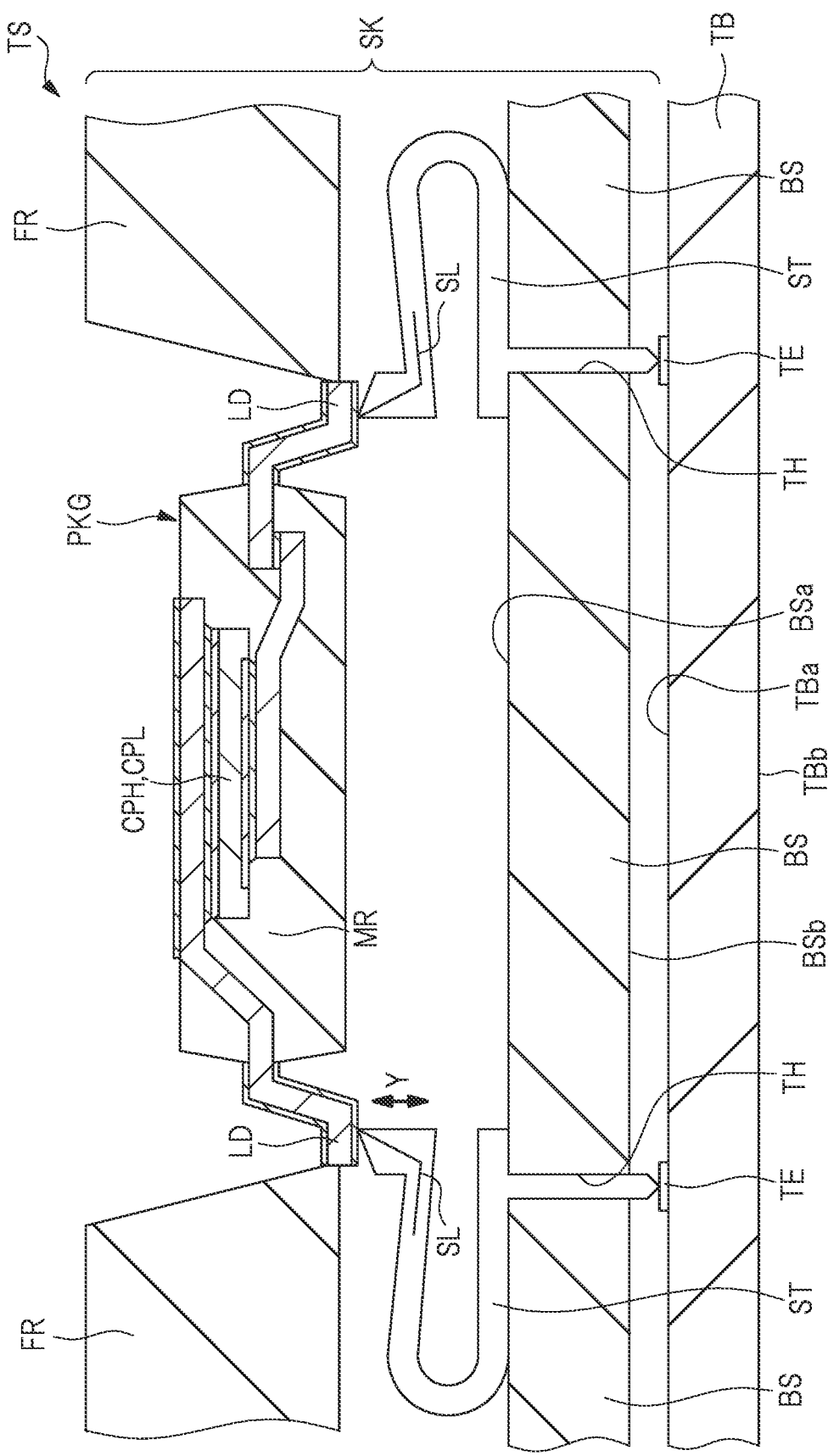
FIG. 8 is an explanatory diagram showing the test step of the semiconductor device.
Figure 9:
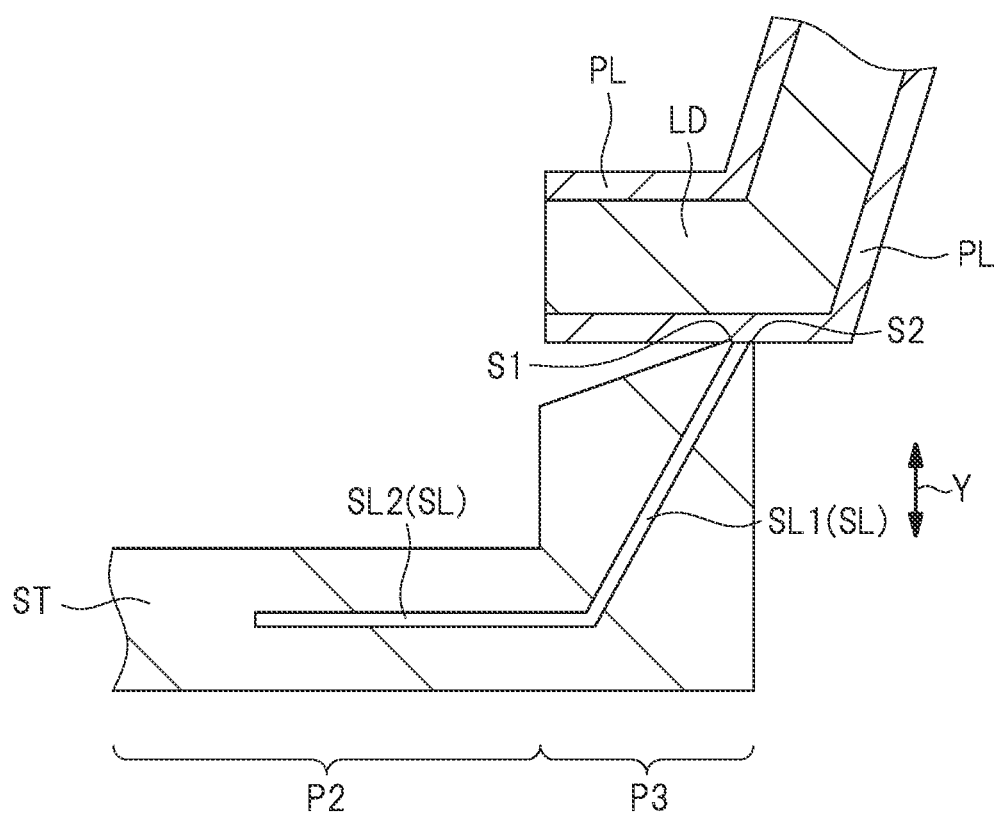
FIG. 9 is a partially enlarged view showing a part of FIG. 8 in an enlarged manner.
Figure 10:
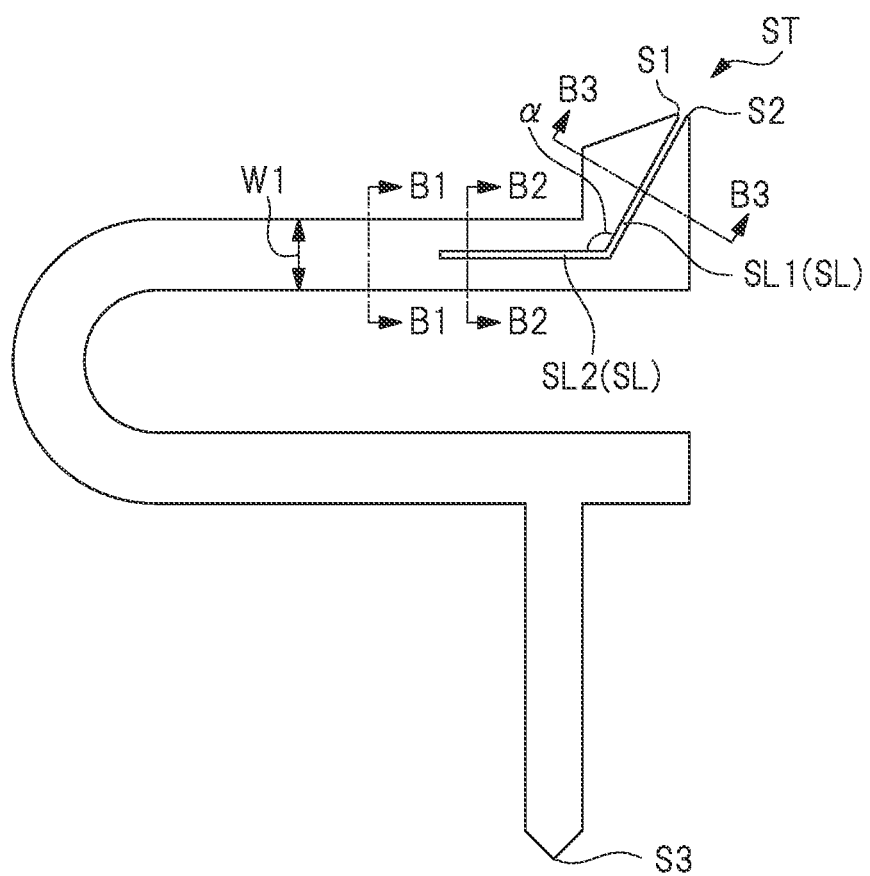
FIG. 10 is a side view showing a socket terminal of one embodiment.
Figure 11:
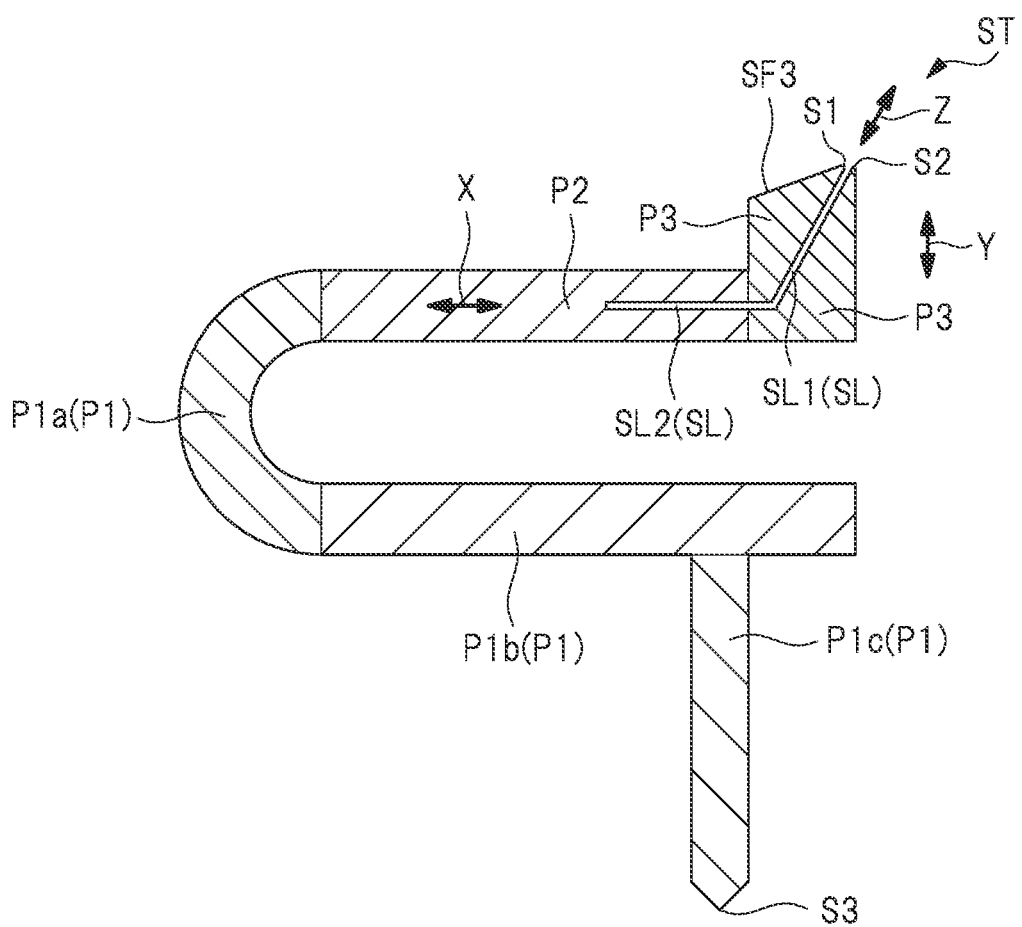
FIG. 11 is a side view showing the socket terminal of one embodiment.
Figure 12:
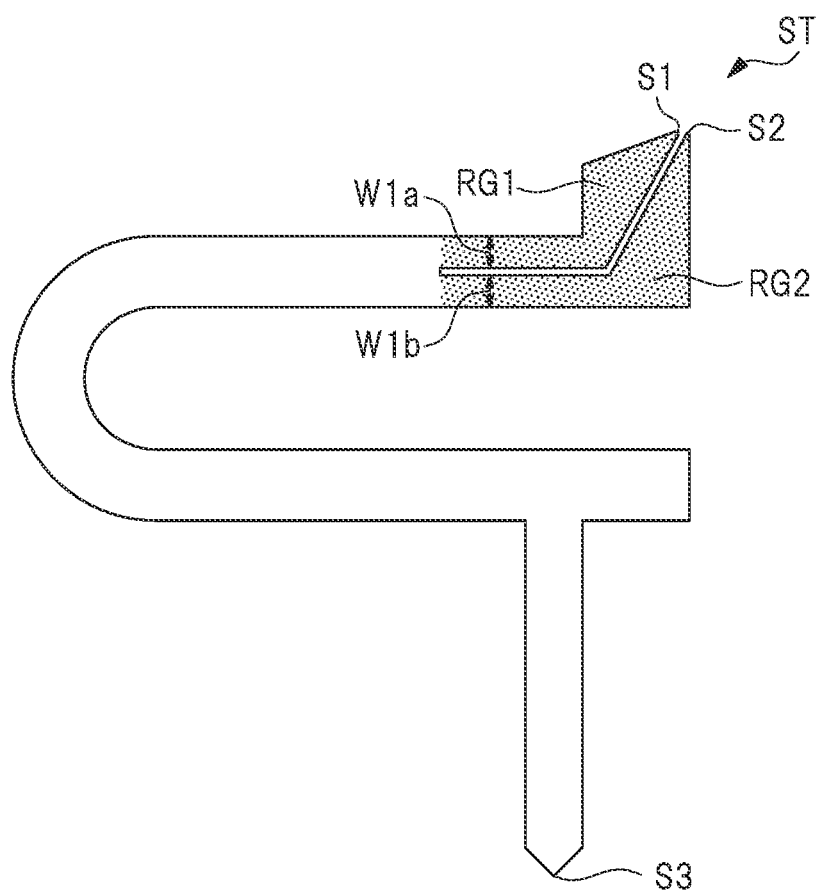
FIG. 12 is a side view showing the socket terminal of one embodiment.

FIG. 6 is an explanatory diagram (sectional view) showing a part of the test device TS for performing an electrical test to the semiconductor device PKG. FIGS. 7 and 8 are explanatory diagrams each showing a test step of the semiconductor device PKG, and a sectional view corresponding to that of FIG. 7 is shown. FIG. 7 corresponds to a state in which the semiconductor device PKG to be inspected is arranged in the socket SK of the test device TS shown in FIG. 6. Further, FIG. 8 corresponds to a state in which the semiconductor device PKG is pushed toward a side of the socket terminal ST after the semiconductor device PKG is arranged as shown in FIG. 7. FIG. 9 is a partially enlarged view showing a part of FIG. 8 in an enlarged manner. FIG. 10 is a side view (plan view) showing the socket terminal ST used in the test device TS. FIGS. 11 and 12 are also side views (plan views) of the socket terminal ST similarly to FIG. 10. However, in FIG. 11, a support portion P1a, a portion P1b, a portion P1c, a plate-shaped portion P2, and a tip portion P3 are shown by using mutually different hatchings so that the support portion P1a, the portion P1b, the portion P1c, the plate-shaped portion P2, and the tip portion P3 constituting the socket terminal ST can be discriminated.

Figure 13:
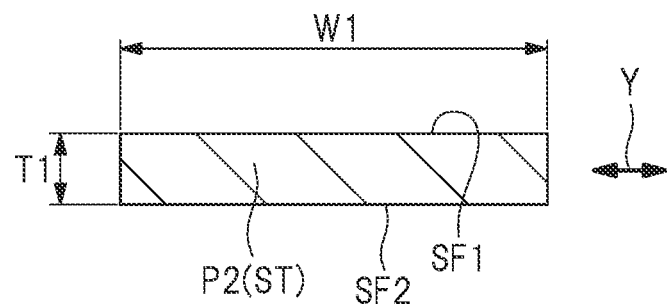
FIG. 13 is a sectional view of the socket terminal of FIG. 10.
Figure 14:
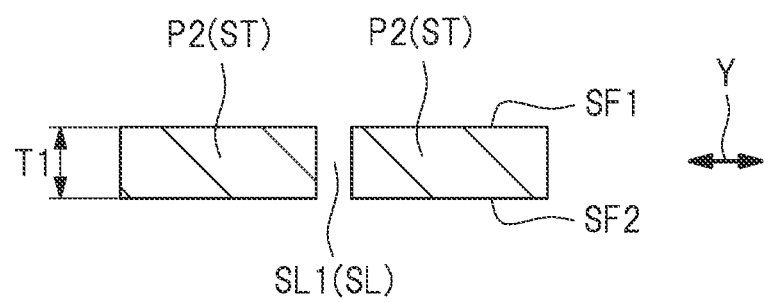
FIG. 14 is a sectional view of the socket terminal of FIG. 10.
Figure 15:
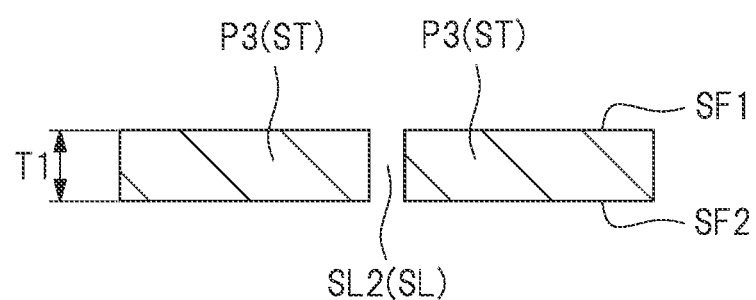
FIG. 15 is a sectional view of the socket terminal of FIG. 10.

Further, in FIG. 12, regions RG1, RG2 are shown by using dotted-hatchings so that the regions RG1, RG2 constituting the socket terminal ST can be discriminated. FIGS. 13 to 15 are sectional views of the socket terminal ST. The sectional view of the socket terminal ST taken at a position of line B1-B1 in FIG. 10 corresponds substantially to that of FIG. 13, the sectional view of the socket terminal ST taken at a position of line B2-B2 of FIG. 10 substantially corresponds to that of FIG. 14, and the sectional view of the socket terminal ST taken at a position of line B3-B3 in FIG. 10 substantially corresponds to that of FIG. 15.

First, with reference to FIGS. 6 to 15, a configuration of the test device (electrical test device, inspection device, tester) TS for performing the test step will be described.

The test device TS includes a socket (accommodation portion) SK for accommodating the semiconductor device PKG to be inspected, and a test substate (wiring board, performance board) TB electrically connected to the semiconductor device PKG via the socket SK. The test device TS further includes a control unit (not shown) that is electrically connected to the test substrate TB. The control unit is formed with a control circuit that controls the test step, a test circuit that inputs and outputs signals and test voltages to and from the semiconductor device PKG, and the like. The test circuit formed in the control unit is electrically connected to the semiconductor device PKG via the test substrate TB and the socket SK.

The test substrate TB is a wiring board having an upper surface TBa on which the socket SK is mounted and a lower surface (back surface) TBb located on an opposite side of the upper surface TBa. A conductor pattern (conductor layer) including a plurality of terminals (electrodes) TE is formed on the upper surface TBa of the test substrate TB. The terminal TE is a terminal for being brought into contact with the socket terminal ST. The plurality of terminals TE formed on the upper surface TBa of the test substate TB are electrically connected to the test circuit formed in the control unit via a wiring (not shown) formed on the upper surface TBa of the test substrate TB, a via wiring (not shown) penetrating the test substrate TB, a wiring (not shown) formed on the lower surface TBb of the test substrate TB, and the like.

The socket SK is arranged on the upper surface TBa of the test substrate TB. The socket SK includes a base portion (pedestal) BS, a plurality of socket terminals ST, and an outer frame portion FR. The socket terminal ST is a terminal used for the electrical test of the semiconductor device and can be regarded as an inspection terminal. The number of socket terminals ST included in the socket SK can be set to an appropriate number according to the semiconductor device PKG to be inspected. For example, the number of socket terminals ST included in the socket SK can be a number corresponding to the number of external terminals (here, lead LD) of the semiconductor device PKG to be inspected.

The socket terminal ST is provided to electrically connect the lead LD of the semiconductor device PKG and the terminal TE of the test substate TB via the socket terminal ST. The base portion BS has a plurality of through holes TH, and a part (portion P1c) of the socket terminal ST is inserted into each through hole TH from an upper surface BSa side of the base portion BS. Therefore, a part (portion P1c) of each socket terminal ST is arranged (accommodated) in the through hole TH of the base portion BS. An end portion S3 (see FIG. 10) of the portion P1c of the socket terminal ST protrudes from a lower surface BSb of the base portion BS (see FIGS. 6 to 8), contacts with the terminal TE of the upper surface TBa of the test substrate TB, and is electrically connected to the terminal TE.

Incidentally, the upper surface BSa and the lower surface BSb of the base portion BS are mutually located on opposite sides in the base portion BS, and the lower surface BSb of the base portion BS faces an upper surface TBa of the test substrate TB. The base portion BS is, for example, a plate-shaped member.

The outer frame portion FR has a package accommodating portion (opening) capable of accommodating the semiconductor device PKG and, in the test step, the semiconductor device PKG can be arranged in the package accommodating portion of the outer frame portion FR as shown in FIGS. 7 and 8. The package accommodating portion of the outer frame portion FR is surrounded by the outer frame portion FR in a plan view. The base portion BS is arranged below the package accommodating portion of the outer frame portion FR. Incidentally, the plan view corresponds to a case of being viewed in a plane substantially parallel to the upper surface Tba of the test substrate TB.

The base portion BS and the outer frame portion FR may be separate members or may be integrated members. When the base portion BS and the outer frame portion FR are used as separate members, for example, the present embodiment can adopt a structure in which a periphery of the base portion BS is surrounded by the outer frame portion FR in a plan view. Further, when the base portion BS and the outer frame portion FR are used as separate members, the outer frame portion FR can be fixed to the test substrate TB. A method of fixing the outer frame portion FR is not particularly limited, but the outer frame portion FR can be fixed to the test substrate TB by, for example, a screw (not shown). The outer frame portion FR and the base portion BS are mainly made of an insulating material such as a resin.

Next, a configuration of the socket terminal ST used in the test device TS of the present embodiment will be described in more detail with reference to FIGS. 10 to 15.

As can be seen from FIGS. 10 to 15, the socket terminal ST is a member that is integrally formed as a whole. Specifically, the socket terminal ST integrally has: a main body portion P1 including a curved support portion P1a; a plate-shaped portion (beam portion, beam portion) P2 integrally connected to the support portion P1a; and a tip portion P3 integrally connected to the plate-shaped portion P2.

Incidentally, which parts of the socket terminal ST the support portion P1a, the plate-shaped portion P2, and the tip portion P3 correspond to can be easily understood by referring to FIGS. 10 and 11. In FIG. 11, the plate-shaped portion P2 and the tip portion P3 have different hatching directions, and the support portion P1a and the plate-shaped portion P2 have different hatching directions.

The plate-shaped portion P2 of the socket terminal ST extends in an X direction (see FIG. 11). One of both ends (both ends mutually located on opposite sides in the X direction) of the plate-shaped portion P2 is integrally connected to the support portion P1a, and the tip portion P3 is integrally connected to the other. The plate-shaped portion P2 and the tip portion P3 have substantially the same thickness T1 (see FIGS. 13 to 15), and a thickness T1 is smaller than a width W1 (see FIGS. 10 and 13) of the plate-shaped portion P2. Here, in the plate-shaped portion P2 and the tip portion P3, a direction substantially perpendicular to each paper face of FIGS. 10 to 12 (accordingly, a direction substantially perpendicular to the X direction shown in FIG. 11 and a Y direction shown in FIG. 11) is a thickness direction. Consequently, each thickness direction of the plate-shaped portion P2 and the tip portion P3 is a horizontal direction (a direction substantially perpendicular to an up-and-down direction). Further, the width W1 of the plate-shaped portion P2 corresponds to a width (dimension) in a direction substantially perpendicular to the X direction and substantially perpendicular to the thickness direction of the plate-shaped portion P2. When contact portions S1, S2 of the socket terminal ST are brought into contact with the lead LD of the semiconductor device PKG in the test step, a width direction (direction substantially perpendicular to the paper face of FIGS. 7 to 9) of the lead LD and the thickness direction of the socket terminal ST caused to contact with the lead LD is almost the same.

The tip portion P3 of the socket terminal ST has a larger dimension in the Y direction (see FIG. 11) intersecting with the X direction than the plate-shaped portion P2. That is, a portion, which is integrally formed with the plate-shaped portion P2 and whose dimension in the Y direction intersecting with an extending direction (X direction) of the plate-shaped portion P2 is larger than that of the plate-shaped portion P2, corresponds to the tip portion. It corresponds to P3. In the cases of FIGS. 10 to 12, the Y direction and the X direction are orthogonal to each other, but as another form, the present embodiment may also adopt a case where the Y direction and the X direction are deviated (inclined) by a predetermined angle from an orthogonal relationship.

As can be seen from FIGS. 7 and 8, when the semiconductor device PKG is arranged in the package accommodating portion of the socket SK in the test step, the tip portions P3 (contact portions S1, S2) of the socket terminal ST mutually opposes the lead LDs of the semiconductor device PKG in the Y direction. Since the tip portion P3 of the socket terminal ST has a larger dimension in the Y direction than the plate-shaped portion P2 of the socket terminal ST, the tip portion P3 protrudes in the Y direction so as to approach the lead LD of the semiconductor device PKG with respect to the plate-shaped portion P2.

Consequently, in the socket terminal ST, the tip portion P3 is a portion that is integrally connected to the plate-shaped portion P2 and protrudes toward the lead LD of the semiconductor device PKG to be inspected. When the lead LD of the semiconductor device PKG to be inspected is arranged above the socket terminal ST, the Y direction corresponds to an up-and-down direction and, in the socket terminal ST, the tip portion P3 protrudes upward with respect to the plate-shaped portion P2. In the test step, the lead LD of the semiconductor device PKG to be inspected contacts with the tip portion P3 (more specifically, the contact portions S1, S2 existing in the tip portion P3) of the socket terminal ST.

Since the support portion P1a of the socket terminal ST that supports the plate-shaped portion P2 has a curved shape, the socket terminal ST can be bent as a leaf spring.

When the socket terminal ST bends, the tip portion P3 connected to the plate-shaped portion P2 and the contact portions S1, S2 provided at the tip portion P3 can be displaced in the Y direction. Since the support portion P1a is curved, it extends in a curved shape. More specifically, the support portion P1a is curved in a semicircular shape. Since the support portion P1a is a curved portion, it can also be regarded as a curved portion.

In addition to the support portion P1a, the main body portion P1 of the socket terminal ST integrally has a portion P1c inserted into the through hole TH of the base portion BS and a portion P1b extending (arranged) on the upper surface BSa of the base portion BS. The plate-shaped portion P2 is integrally connected to one of both ends of the curved support portion P1a, and the portion P1b is integrally connected to the other. The plate-shaped portion P2 and the portion P1b integrally connect with each other via the curved support portion P1a. Consequently, the plate-shaped portion P2 is supported by the portion P1b via the curved support portion P1a. The portion P1b extends on the upper surface BSa of the base portion BS so as to be along the upper surface BSa of the base portion BS. In the socket terminal ST, the plate-shaped portion P2 is separated from the portion P1b of the main body portion P1 at a predetermined interval in the Y direction. Consequently, the plate-shaped portion P2 of the socket terminal ST is separated from the upper surface BSa of the base portion BS in the Y direction at a predetermined interval. The support portion P1a and the portion P1c integrally connect with each other via the portion P1b. An end portion S3 corresponds to an end portion of the portion P1c that is opposite to a side connected to the portion P1b. That is, one end portion S3 of the portion P1c faces a terminal TE of the test substrate TB, and an end portion of the portion P1c on the opposite side thereto is integrally connected to the portion P1b.

Since the portion P1c of the socket terminal ST is inserted into the through hole TH from the upper surface BSa side of the base portion BS, the end portion S3 of the portion P1c of the socket terminal ST protrudes from the lower surface BSb of the base portion BS and faces a terminal TE of the upper surface TBa of the test substrate TB (see FIGS. 6 to 8). When the end portion S3 of the portion P1c of the socket terminal ST contacts with the terminal TE of the test substrate TB, the socket terminal ST and the terminal TE of the test substrate TB are electrically connected to each other.

The support portion P1a, the portion P1b, the portion P1c, the plate-shaped portion P2, and the tip portion P3 are not separate members but integrated members. Consequently, by deforming one member (metal member), the socket terminal ST integrally having the support portion P1a, the portion P1b, the portion P1c, the plate-shaped portion P2, and the tip portion P3 can be manufactured.

Further, the socket terminal ST has a slit (slit portion) SL. In the socket terminal ST, the slit SL is formed from the tip portion P3 to the plate-shaped portion P2. In the socket terminal ST, the slit SL has not reached the support portion P1a and, therefore, the slit SL is not formed in the support portion P1a. That is, in the socket terminal ST, the slit SL is formed from the tip portion P3 to the middle of the plate-shaped portion P2, and is terminated in the middle of the plate-shaped portion P2.

The tip portion P3 and the plate-shaped portion P2 have planes SF1, SF2 substantially parallel to the X and Y directions, and the slit SL is formed so as to penetrate between the planes SF1 and the plane SF2 (see FIGS. 13 to 15). Incidentally, the plane SF1 and the plane SF2 are planes mutually located on opposite sides, and a direction substantially perpendicular to the planes SF1 and SF2 is the thickness direction.

The slit SL formed in the socket terminal ST has a slit portion SL1 and a slit portion SL2 connecting with the slit portion SL1. The slit portion SL1 is formed at the tip portion P3 so as to extend in a direction (Z direction, see FIG. 11) intersecting with an extending direction (X direction) of the slit portion SL2. One end portion of the slit portion SL1 extending in the Z direction connects with one end portion of the slit portion SL2. Meanwhile, the other end portion of the slit portion SL1 extending in the Z direction reaches an outer periphery of the tip portion P3 and is opened. The slit portion SL2 extends from the slit portion SL1 toward the support portion P1a along the extending direction (X direction) of the plate-shaped portion P2, and is terminated in the middle of the plate-shaped portion P2. That is, an end portion of the slit portion SL2 on a side opposite to a side connecting with the slit portion SL1 is located in the middle of the plate-shaped portion P2 extending in the X direction and, therefore, the slit portion SL2 does not reach the support portion P1a. The slit portion SL2 is continuously formed in the tip portion P3 and the plate-shaped portion P2.

The tip portion P3 of the socket terminal ST has a contact portion (tip, protrusion portion, projection portion) S1 and a contact portion (tip, protrusion portion, projection portion) S2 separated from each other by way of the slit SL. The contact portions S1, S2 correspond to portions of the socket terminal ST that are brought into contact with the lead LD of the semiconductor device PKG in the test step. In the test step, the tip portion P3 of the socket terminal ST and the lead LD of the semiconductor device PKG are faced to each other in the Y direction, and both the contact portion S1 and the contact portion S2 contact with the lead LD of the semiconductor device PKG (see FIG. 9). The contact portion S1 and the contact portion S2 of the socket terminal ST are adjacent to each other so as to sandwich the slit SL therebetween in the X direction.

Since the slit SL is formed in the socket terminal ST, a part (the entire tip portion P3 and a part of the plate-shaped portion P2) of the socket terminal ST is divided into two regions (portions) RG1, RG2 adjacent to each other so as to sandwich the slit SL therebetween.

Which parts of the socket terminal ST the region RG1 and the region RG2 described here correspond to can be easily understood by referring to FIGS. 10 and 12. In FIG. 12, an area with the dotted hatchings corresponds to the regions RG1, RG2, and one of two adjacent areas (areas with the dotted hatchings) sandwiching the slit SL therebetween corresponds to the region RG1, and the other thereof corresponds to the region RG2.

Each of the region RG1 and the region RG2 is an area from the tip portion P3 to the middle (a position where the slit SL ends) of the plate-shaped portion P2, but the region RG1 and the region RG2 sandwich the slit SL therebetween and are separated from each other. The socket terminal ST has two (pairs of) contact portions S1, S2 for causing it to contact with the lead LD of the semiconductor device PKG to be inspected, and the contact portions S1 that is one of them is located in the region RG1 and the contact portion S2 that is the other of them is located in the region RG2.

In the socket terminal ST, the region RG1 and the region RG2 are separated from each other so as to sandwich the slit SL therebetween, so that they can flex independently of each other. That is, the region RG1 can be relatively displaced to the region RG2, and the region RG2 can be relatively displaced to the region RG1. Consequently, a relative position between the contact portion S1 located in the region RG1 and the contact portion S2 located in the region RG2 can be displaced. That is, the contact portion S1 can be relatively displaced to the contact portion S2, and the contact portion S2 can be relatively displaced to the contact portion S1.

Further, the socket terminal ST has contact portions S1, S2 for causing it to contact with the lead LD of the semiconductor device PKG to be inspected, and the end portion S3 for causing it to contact with the terminal TE of the test substrate TB. In the terminal ST, the contact portions S1, S2 and the end portions S3 are mutually located on opposite sides. Consequently, when a current flows in the semiconductor device PKG via the socket terminal ST in the test step, the current flows between the end portion S3 and the contact portions S1, S2 in the socket terminal ST.

<About Test Step>

The test step for performing an electrical test to the semiconductor device PKG by using the test device TS will be described.

First, the test device TS is prepared. The preparation of the test device TS may be performed before or after the preparation of the semiconductor device PKG to be inspected, or may be performed at the same time as the preparation of the semiconductor device PKG to be inspected. Since the configuration of the test device TS has been described above, a repetitive description thereof will be omitted here.

In the test step, first, as shown in FIG. 7, the semiconductor device PKG to be inspected is placed in the package accommodating portion of the socket SK of the test device TS. By doing so, the socket terminal ST and the semiconductor device PKG are arranged such that the tip portion P3 of the socket terminal ST and the lead LD of the semiconductor device PKG are opposed to each other in the Y direction. Specifically, when the semiconductor device PKG is arranged in the socket SK, the contact portions S1, S2 of each socket terminal ST of the socket SK face the lead LD of the semiconductor device PKG, and the end portion S3 of each socket terminal ST face the terminal TE of the test substrate TB. At this stage, it is not essential that the contact portions S1, S2 of the socket terminal ST contact with (is electrically connected to) the lead LD of the semiconductor device PKG, but in the case of FIG. 7, both of the contact portions S1, S2 of the socket terminal ST contact with and are electrically connected to the lead LD of the semiconductor device PKG. Further, at this stage, it is not essential that the end portion S3 of the socket terminal ST contacts with and is electrically connected to the terminal TE of the test substate TB, but in the case of FIG. 7, the end portion of the socket terminal ST S3 contacts with and is electrically connected to the terminal TE of the test substrate TB.

Then, as shown in FIG. 8, the semiconductor device PKG is pressed by a pressing jig (not shown) or the like, and the semiconductor device PKG is pushed downward (toward the base portion BS or the test substrate TB). By doing so, the socket terminal ST is bent, so that the contact portions S1, S2 of the socket terminal ST surely contact with and are electrically connected to the lead LD of the semiconductor device PKG. Further, the end portion S3 of the socket terminal ST surely contacts with and is electrically connected to the terminal TE of the test substrate TB.

As a result, the contact portions S1, S2 of each socket terminal ST electrically contact with the lead LD of the semiconductor device PKG, and the end portion S3 of each socket terminal ST electrically contacts with the terminal TE of the test substrate TB. Consequently, the lead LD of the semiconductor device PKG and the terminal TE of the test substrate TB are electrically connected to each other through the socket terminal ST, and the plurality of leads LD of the semiconductor device PKG are electrically connected to the test circuit formed in the control unit of the test device TS via the plurality of socket terminals ST and the conductor portion (including the terminal TE) of the test substrate TB.

In this state, by supplying a current or a voltage from the test circuit via the test substrate TB, the socket terminal ST, and the lead LD of the semiconductor device PKG to a semiconductor chip (here, one or more of the semiconductor chips CPC, CPH, and CPL) that the semiconductor device PKG has, the electric test of the semiconductor device PKG can be performed. For example, by measuring electrical characteristics of the semiconductor device PKG, whether the electrical characteristics of the semiconductor device PKG are adequate (good or bad) is inspected. The socket terminal ST is used as a transmission path for transmitting a current or voltage, which is inputted from the terminal TE of the test substrate TB, to the lead LD of the semiconductor device PKG.

In reality, since the semiconductor device PKG has the plurality of leads LD and the socket SK has the plurality of socket terminals ST, the plurality of leads LD and the plurality of socket terminal STs are brought into contact with one another to perform the electrical test of the semiconductor device PKG.

Thereafter, a pressing force applied to the semiconductor device PKG by the pressing jig or the like is released, and the semiconductor device PKG for which the electrical test has been completed is taken out from the socket SK. Then, the semiconductor device PKG to be inspected next is arranged in the package accommodating portion of the socket SK as shown in FIG. 7, and the semiconductor device PKG is pushed in as shown in FIG. 8 to perform the electrical test of the semiconductor device PKG. By repeating this, a plurality of semiconductor devices PKG can be sequentially subjected to the electrical tests.

<Main Features and Effects>

There are various types of socket terminals used in the test step of the semiconductor device. For example, there is a socket terminal called pogo-pin in which a rod-shaped terminal having a sharp tip portion is displaced in a vertical direction. Since the pogo-pin is configured by two plungers arranged so as to face each other via an elastic body such as a spring, it is not suitable for the test step necessary for passing a large current via the socket terminal to the semiconductor device due to connection resistance generated between the two plungers.

Meanwhile, in the present embodiment, the socket terminal ST is an integral member, and is a socket terminal having a so-called leaf spring structure. In order to electrically connect the lead LD of the semiconductor device PKG and the terminal TE of the test substrate TB with the socket terminal ST configured by an integral member, the lead LD of the semiconductor device PKG and the terminal TE of the test substrate TB can be connected via the socket terminal ST with low resistance. Consequently, the test device TS of the present embodiment is suitable for performing the test step or the like in which a large current needs to pass through the semiconductor device PKG via the socket terminal ST.

In the present embodiment, the socket terminal ST reflects a socket terminal having a leaf spring, and has: the main body portion P1 including the curved support portion P1a; the plate-shaped portion P2 integrally connected to the support portion P1a and extending in the X direction; and the tip portion P3 that is integrally connected to the plate-shaped portion P2 and whose dimension in the Y direction intersecting with the X direction is larger than that of the plate-shaped portion P2.

One of the main features of the present embodiment is that the socket terminal ST has the slit SL. In the socket terminal ST, the slit SL is formed from the tip portion P3 to the plate-shaped portion P2, but does not reach the curved support portion P1a. The socket terminal ST has two contact portions S1, S2 separated from each other by way of the slit SL at the tip portion P3 and, in the test step, the tip portion P3 of the socket terminal ST and the lead LD of the semiconductor device PKG are opposed to each other in the Y direction, and the respective contact portions S1, S2 of the socket terminal ST electrically contact with the external terminal of the semiconductor device PKG.

In the present embodiment, the two contact portions S1, S2 separated from each other by way of the slit SL in the socket terminal ST are brought into contact with the lead LD of the semiconductor device PKG to perform the electrical test of the semiconductor device PKG. Consequently, the socket terminal ST and the lead LD of the semiconductor device PKG leads to being electrically connected not only at one place but also at two places (contact portions S1, S2). Therefore, in the electrical test, the current flowing between the socket terminal ST and the lead LD of the semiconductor device PKG is divided into a path of passing through the contact portion S1 of the socket terminal ST and a path of passing through the contact portion S2 of the socket terminal ST and flows. This makes it possible to suppress a local temperature rise that may occur at a connecting point between the socket terminal ST and the lead LD of the semiconductor device PKG. As a result, a defect caused by the temperature rise at the connecting point between the socket terminal ST and the lead LD of the semiconductor device PKG can be suppressed and prevented, and the reliability of the electrical test can be improved. Further, in the present embodiment, since the socket terminal is provided with the slit SL (that is, a plurality of contact portions are provided), the contact resistance between the socket terminal ST and the external terminal of the semiconductor device PKG can also be reduced as compared with a case of not providing the socket terminal ST with the slit (that is, a case of one contact portion).

Incidentally, the defect caused by the temperature rise at the connecting point between the socket terminal ST and the lead LD of the semiconductor device PKG is, for example, a defect caused by the plating layer PL made of a solder material melting and the solder material adhering to the socket terminal ST. When the solder material adheres to the socket terminal ST, the solder material is oxidized and the connecting resistance between the socket terminal ST and the lead LD of the semiconductor device PKG may increase. This leads to a decrease in the reliability of the electrical test. Moreover, as another defect caused by the temperature rise at the connecting point between the socket terminal ST and the lead LD of the semiconductor device PKG, the plating layer PL made of a solder material melts, which may result in poor appearance of the semiconductor device PKG. This leads to a decrease in manufacturing yield of the semiconductor devices.

In the present embodiment, in the test step, the contact portions S1, S2 of the socket terminal ST electrically contact with the lead LD of the semiconductor device PKG, so that the melt of the plating layer PL made of a solder material can be suppressed or prevented. As a result, the adhesion of the solder material to the socket terminal ST and the occurrence of the poor appearance of the semiconductor device PKG can be suppressed or prevented. This makes it possible to improve the reliability of the electrical test. In addition, the manufacturing yield of the semiconductor device can be improved.

Then, in the present embodiment, the socket terminal ST is provided with the slit SL. Consequently, in the socket terminal ST, the region RG1 and the region RG2 can flex (displace) independently of each other, so that a relative position in the Y direction between the contact portion S1 (contact portion S1 located in the region RG1) and the contact portion S2 (contact portion S2 located in the region RG2), which are separated from each other by way of the slit SL, becomes displaceable. Therefore, when the semiconductor device PKG is pushed as shown in FIGS. 8 and 9, the lead LD of the semiconductor device PKG is pushed toward the tip portion P3 of the socket terminal ST, so that both the contact portion S1 and the contact portion S2 of the socket terminal ST can be reliably caused to contact with the lead LD of the semiconductor device PKG. As described above, this makes it possible to suppress, in the test step, the local temperature rise that may occur at the connecting point between the socket terminal ST and the lead LD of the semiconductor device PKG, and to suppress or prevent the defect caused by the temperature rise. For this reason, the reliability of the electrical test can be improved. In addition, the manufacturing yield of the semiconductor device can be improved.

FIGS. 16 to 21 are explanatory views of the test step, and each show an area near the contact portions S1, S2 of the socket terminal ST.

Figure 16:
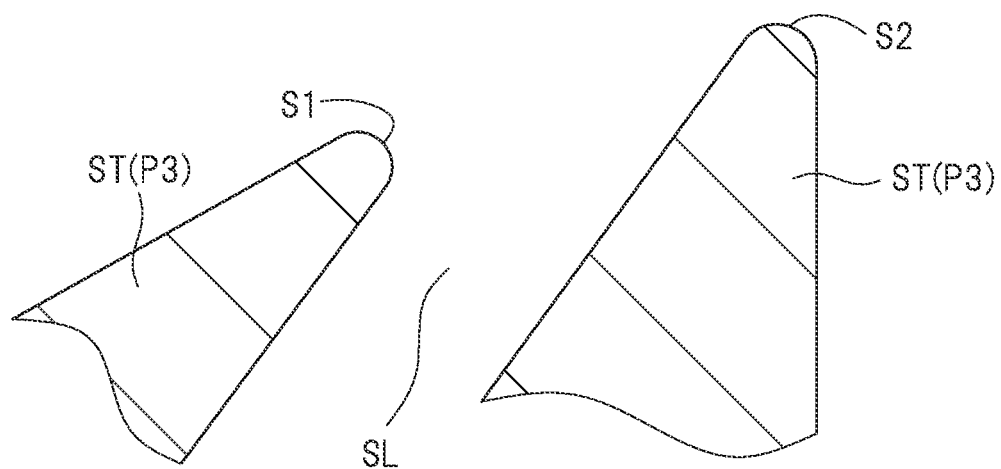
FIG. 16 is an explanatory diagram of a test step of the semiconductor device.
Figure 17:
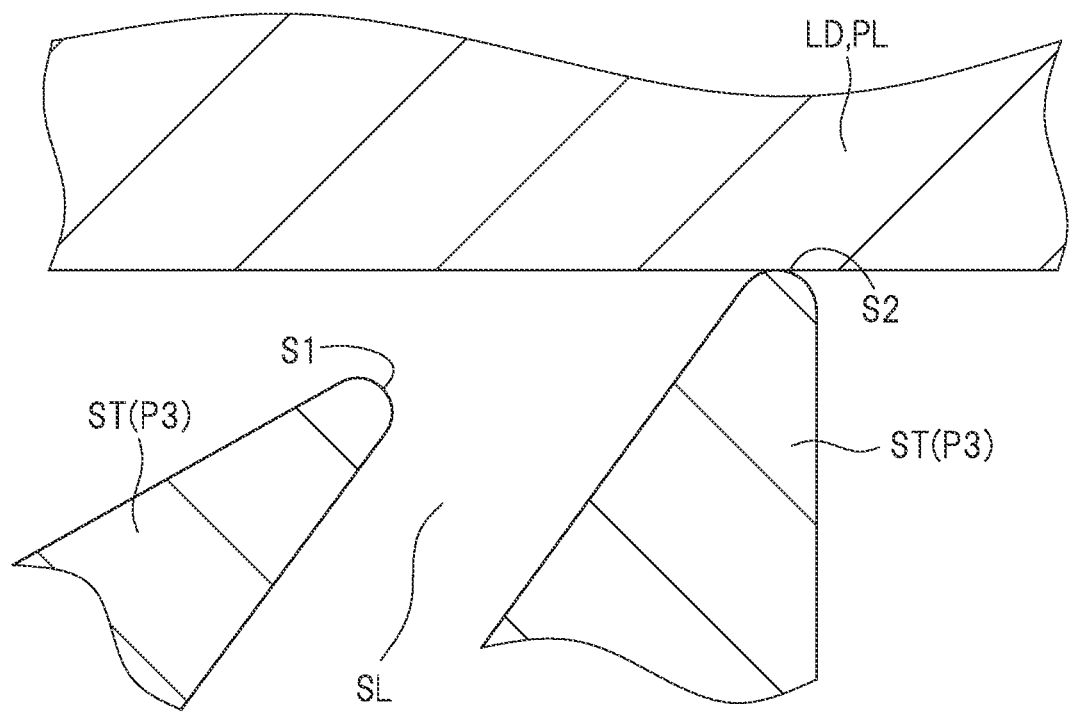
FIG. 17 is an explanatory diagram of the test step of the semiconductor device.

For example, as shown in FIG. 16, at a stage before arranging the semiconductor device PKG in the package accommodating portion of the socket SK, it is assumed that a height position of the contact portion S1 of the socket terminal ST in the Y direction (up-and-down direction) is lower than a height position of the contact portion S2 of the socket ST in the Y direction (up-and-down direction) to some extent. In this case, when the semiconductor device PKG is arranged in the package accommodating portion of the socket SK, first, as shown in FIG. 17, the lead LD of the semiconductor device PKG contacts with the contact portion S2 of the socket terminal ST, but is in a state of not sufficiently contacting with the contact portion S1 of the socket terminal ST. However, if the semiconductor device PKG is pushed therein, the region RG1 and the region RG2 of the socket terminal ST can be displaced independently when the socket terminal ST bends, so that the relative positional relationship in the Y direction (up-and-down direction) between the contact portion S1 and the contact portion S2 changes. As a result, as shown in FIG. 18, both the contact portions S1, S2 of the socket terminal ST are in a state of sufficiently contacting with the lead LD of the semiconductor device PKG.

Figure 19:
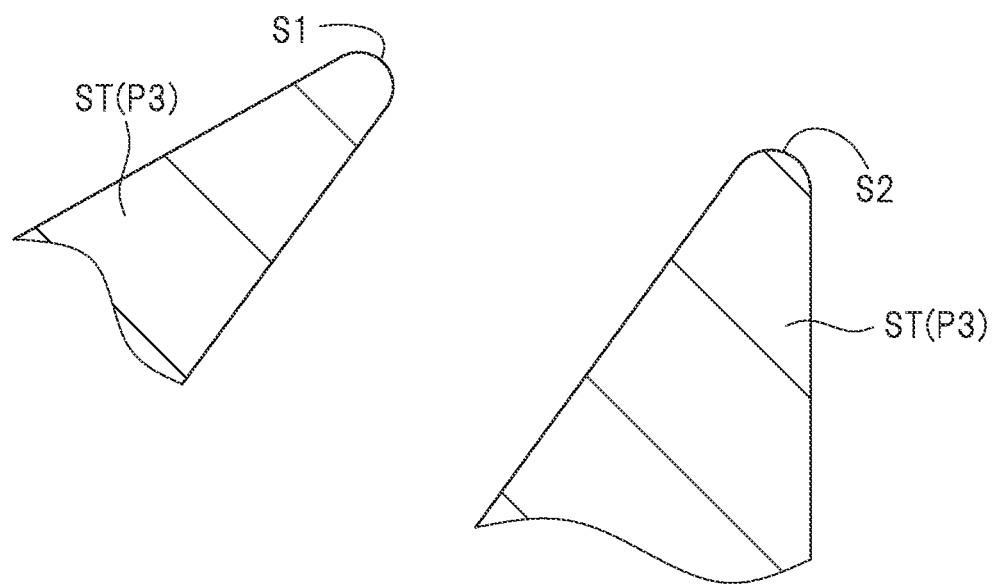
FIG. 19 is an explanatory diagram of the test step of the semiconductor device.
Figure 20:
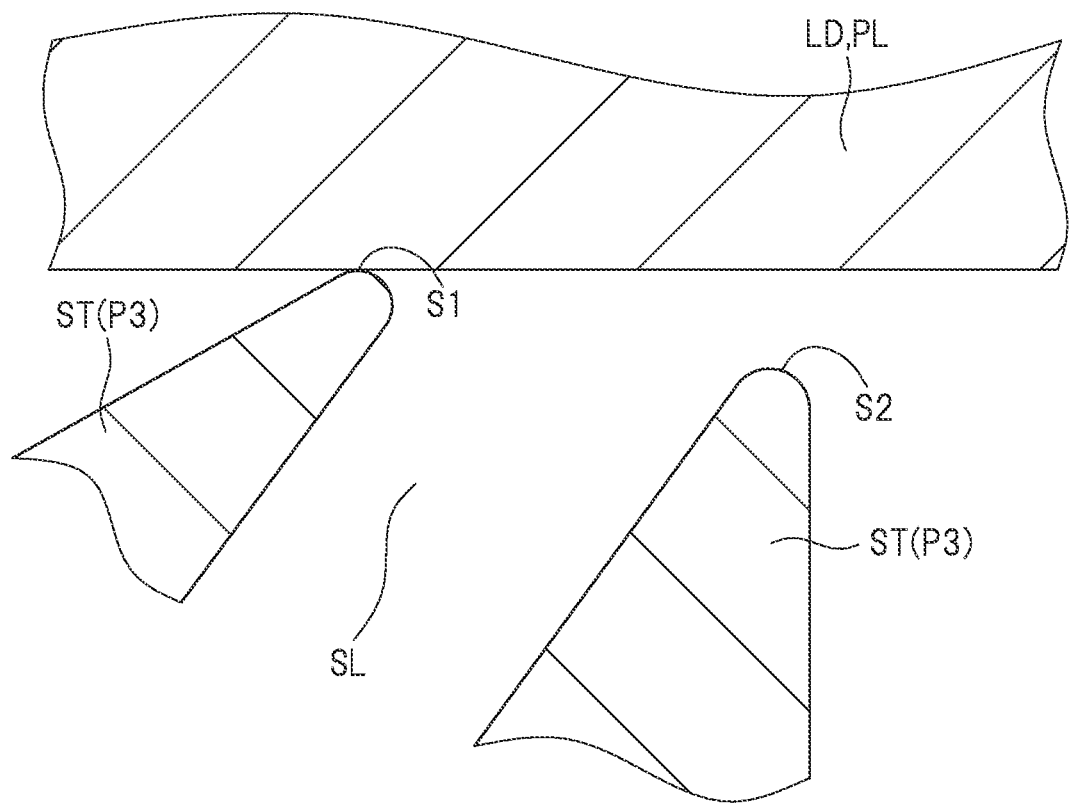
FIG. 20 is an explanatory diagram of the test step of the semiconductor device.

Further, as shown in FIG. 19, at the stage before arranging the semiconductor device PKG in the package accommodating portion of the socket SK, it is assumed that the height position of the contact portion S2 of the socket terminal ST in the Y direction (up-and-down direction) is lower than the height position of the contact portion S1 of the socket terminal ST in the Y direction (up-and-down direction) to some extent. In this case, when the semiconductor device PKG is arranged in the package accommodating portion of the socket SK, first, as shown in FIG. 20, the lead LD of the semiconductor device PKG contacts with the contact portion S1 of the socket terminal ST, but is in a state of not sufficiently contacting with the contact portion S2 of the socket terminal ST. However, if the semiconductor device PKG is pushed therein, the region RG1 and the region RG2 of the socket terminal ST can be displaced independently when the socket terminal ST bends, so that the relative positional relationship in the Y direction (up-and-down direction) between the contact portion S1 and the contact portion S2 changes. As a result, as shown in FIG. 21, both the contact portion S1 and the contact portion S2 of the socket terminal ST are in states of sufficiently contacting with the lead LD of the semiconductor device PKG.

Figure 18:
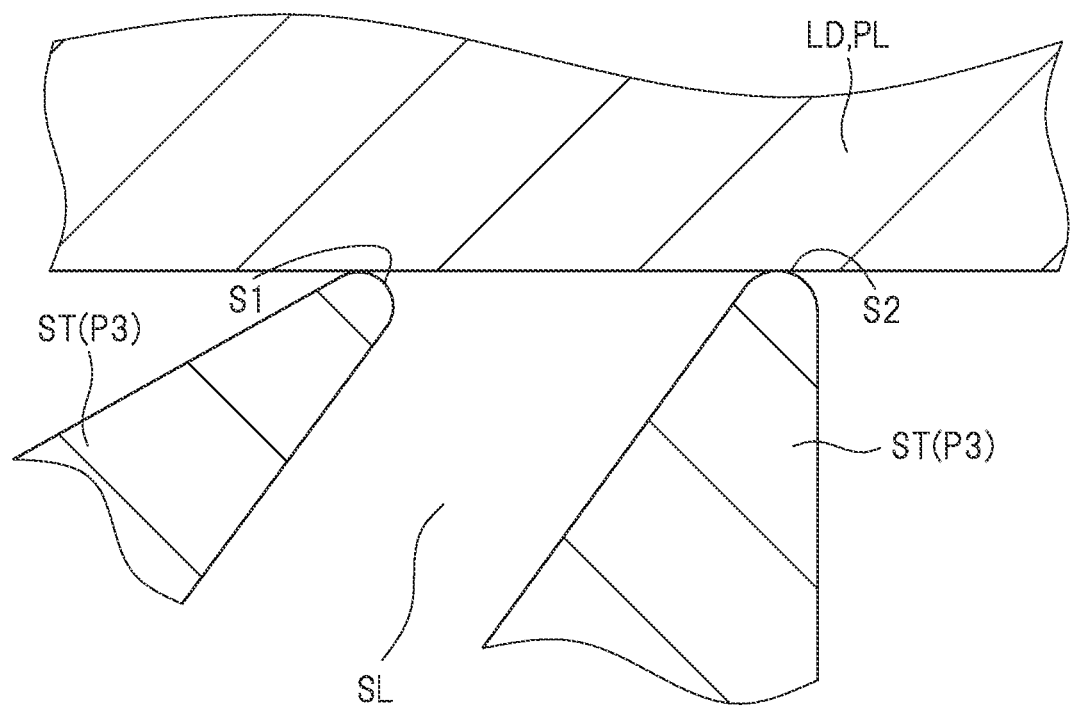
FIG. 18 is an explanatory diagram of the test step of the semiconductor device.
Figure 21:
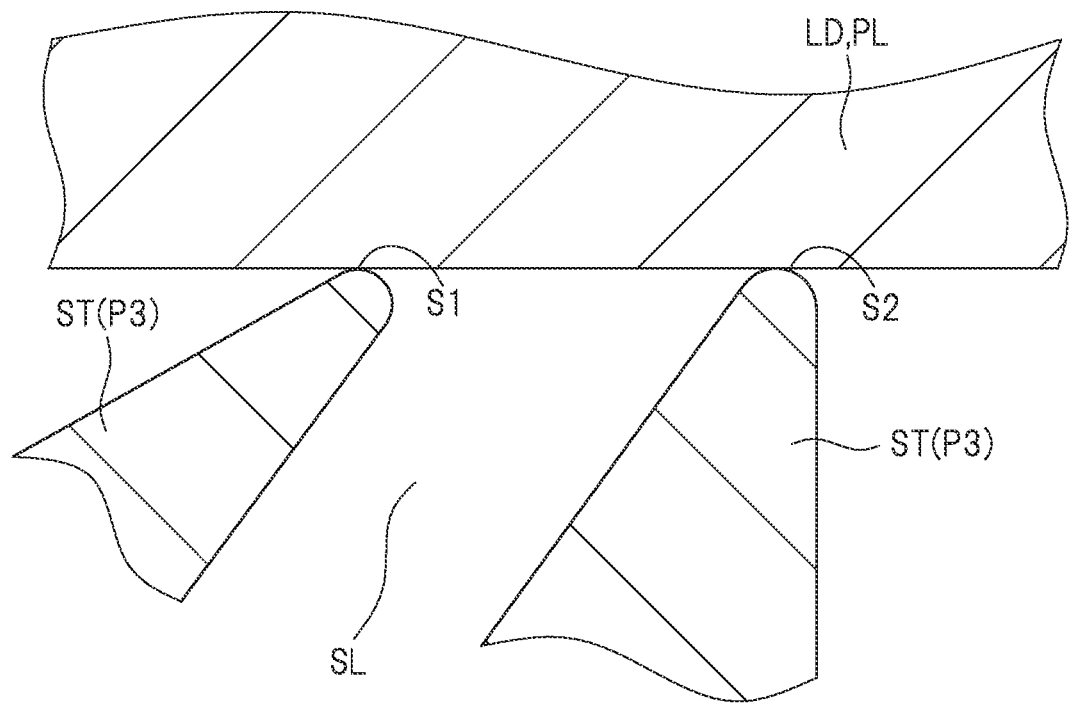
FIG. 21 is an explanatory diagram of the test step of the semiconductor device.

Therefore, in the present embodiment, in the test step, as shown in FIG. 18 or 21, the electrical test of the semiconductor device PKG can be performed in a state where both the contact portion S1 and the contact portion S2 of the socket terminal ST surely contact with the lead LD of the semiconductor device PKG.

Further, in the present embodiment, since the slit SL is provided, a relative position in the Y direction (up-and-down direction) between the contact portion S1 and the contact portion S2 of the socket terminal ST becomes displaceable, so that a margin of the height positions of the contact portion S1 and the contact portion S2 of the ST in the Y direction (up-and-down direction) can be increased. For example, in any of states shown in FIGS. 16 and 19 at the stage before the semiconductor device PKG is arranged in the package accommodating portion of the socket SK, when the semiconductor device PKG is electrically tested, as shown in FIG. 18 or FIG. 21, both the contact portion S1 and the contact portion S2 of the socket terminal ST can be caused to reliably contact with the lead LD of the semiconductor device PKG. Consequently, it becomes easy to manufacture the socket terminal ST, and it becomes easy to manage (control) the steps in manufacturing the socket terminal ST. Further, it becomes easy to prepare and manage the socket SK having the plurality of socket terminals ST and the test device TS including the socket SK. Furthermore, in the test step, the margin at the height positions of the contact portions S1, S2 of the socket terminal ST in the Y direction (up-and-down direction) at the state before arranging the semiconductor device PKG in the package accommodating portion of the socket SK becomes large, so that the management (control) of the test step becomes easy. Therefore, it becomes easy to perform the test step.

Further, in the plate-shaped member P2 of the socket terminal ST, the slit portion SL2 (more specifically, the slit portion SL2) is preferably located at a center (center in the Y direction) of the plate-shaped member P2. That is, it is preferable that a width W1a (see FIG. 12) of the region RG1 in the plate-shaped member P2 and a width W1b (see FIG. 12) of the region RG2 in the plate-shaped member P2 are substantially the same (W1a=W1b). incidentally, the respective widths W1a and W1b correspond to a width (dimension) in a direction substantially parallel to the Y direction. By doing so, rigidity of the region RG1 and rigidity of the region RG2 can be mutually made substantially the same and, as a result, an operation (load, deflection) of the contact portion S1 located in the region RG1 and an operation (load, deflection) of the contact portion S2 located in the region RG2 can be made to substantially match (equalize) with each other.

Further, it is preferable that each of the contact portions S1, S2 of the socket terminal ST is sharp to some extent. By doing so, each of the contact portions S1, S2 of the socket terminal ST is easily bite into the lead LD (more specifically, the plating layer PL on the surface of the lead LD), so that the contact resistance between the lead LD and the socket terminal ST can be further reduced.

By the way, the reason why the slit SL is provided in the socket terminal ST is that the relative position in the Y direction (up-and-down direction) between the contact portion S1 and the contact portion S2 separated from each other by way of the slit SL is made displaceable. Consequently, the slit SL is formed from the tip portion P3 to the plate-shaped portion P2 in the socket terminal ST. Since the slit SL is formed also in the plate-shaped portion P2 having a smaller dimension in the Y direction than the tip portion P3, the region RG1 and the region RG2 separated from each other via the slit SL are easily displaced independently of each other in the Y direction. Thus, in the socket terminal ST, it is effective that the slit SL is formed not only on the tip portion P3 but also on the plate-shaped portion P2.

However, in the present embodiment, in the socket terminal ST, the slit SL is formed from the tip portion P3 to the plate-shaped portion P2, but the slit SL does not reach the curved support portion P1a. That is, in the present embodiment, the slit SL is not formed in the curved support portion P1a.

Unlike the present embodiment, it is assumed that the slit SL reaches the curved support portion P1a and the slit SL is formed also in the curved support portion P1a. In that case, a strength of the support portion P1a of the socket terminal ST is lowered, and when the electrical test is performed to a certain number of semiconductor devices, the socket terminal ST deteriorates and a function as a leaf spring of the socket terminal ST deteriorates, so that the socket terminal ST needs to be replaced. Since the function of the socket terminal ST as a leaf spring is mainly carried out by the curved support portion P1a, life-span of the socket terminal ST tends to be shortened if the slit SL is formed in the curved support portion P1a. However, frequent replacement of the socket terminals becomes a factor of increasing the manufacturing cost of the semiconductor device.

In contrast thereto, in the present embodiment, the slit SL provided in the socket terminal ST does not reach the curved support portion P1a, and the slit SL is not formed in the curved support portion P1a. Consequently, the strength of the support portion P1a of the socket terminal ST can be ensured, and the decrease in the life-span of the socket terminal ST due to the provision of the slit SL in the socket terminal ST can be suppressed or prevented. Therefore, in the case of the present embodiment, the life-span of the socket terminal ST is longer than that in the case where the slit SL is also formed in the curved support portion P1a, and the number of electrical tests of the semiconductor device capable of being performed without replacing the socket terminal ST can be increased. For this reason, the manufacturing cost of the semiconductor device can be suppressed.

Further, if the slit SL is formed in the curved support portion P1a, it becomes difficult to set a stress of the socket terminal ST (a stress as a leaf spring) to an arbitrary design value, so that it becomes difficult to design and manufacture the socket terminal ST. In the present embodiment, since the slit SL is not formed in the curved support portion P1a, the stress of the socket terminal ST (a stress as a leaf spring) is easily set according to a design value(s), so that it becomes easy to design and manufacture the socket terminal ST.

Further, it is preferable that the slit SL has the slit portion SL1 and the slit portion SL2 connecting with the slit portion SL1. The slit portion SL1 extends in the Z direction intersecting with the extending direction (X direction) of the plate-shaped portion P2, and is formed on the tip portion P3 so as to reach the outer periphery of the tip portion P3. The slit portion SL2 extends along the extending direction (X direction) of the plate-shaped portion P2, and terminates in the middle of the plate-shaped portion P2. Since the slit SL has the slit portion SL2, the region RG1 and the region RG2 separated from each other by way of the slit SL are likely to be displaced independently in the Y direction. Then, since the slit SL has the slit portion SL1, the contact portions S1 and the contact portions S2 separated from each other by way of the slit SL are easily formed at positions facing the lead LD of the semiconductor device PKG in the Y direction. Consequently, when the lead LD of the semiconductor device PKG is pushed toward the tip portion P3 of the socket terminal ST, both the contact portion S1 and the contact portion S2 of the socket terminal ST can be caused to more reliably contact with the lead LD of the semiconductor device PKG.

Further, in the present embodiment, an angle α formed by the slit portion SL1 and the slit portion SL2 is larger than 90° (see FIG. 10). Then, the slit portion SL1 reaches the outer periphery of the tip portion P3 at a corner portion of the tip portion P3 of the socket terminal ST. For this reason, the contact portion 31 and the contact portion S2 are adjacent to each other at the corner portion of the tip portion P3 so as to sandwich the slit portion SL2 therebetween. This makes it easier to provide the contact portions S1, S2 facing the lead LD of the semiconductor device PKG and separated from each other by way of the slit SL in the socket terminal ST.

Further, since the tip portion P3 connected to the plate-shaped portion P2 protrudes toward the lead LD side of the semiconductor device PKG in the Y direction, the contact portions S1, S2 provided on the tip portion P3 becomes easier to be caused to contact with the external terminal of the semiconductor device PKG.

Further, in the present embodiment, the tip portion P3 of the socket terminal ST has a surface SF3 (see FIG. 11) opposing the lead LD of the semiconductor device PKG in the test step, and the surface SF3 is inclined with respect to the X direction. Incidentally, the surface SF3 is a surface substantially perpendicular to the surfaces SF1, SF2, and is also a surface substantially parallel to the thickness direction of the socket terminal ST. Specifically, the surface SF3 is inclined with respect to the X direction so as to gradually approach the external terminal of the semiconductor device PKG as a distance from the plate-shaped portion P2 increases. Then, at the corner portion of the tip portion P3 corresponding to the end portion of the surface SF3 (an end portion on a side far from the plate-shaped portion P2), the slit portion SL1 reaches the outer periphery of the tip portion P3. This makes it easy to form the contact portions S1, S2 of the socket terminal ST into a sharp shape to some extent. As a result, each of the contact portions S1, S2 of the socket terminal ST can easily bite into the lead LD (more specifically, the plating layer PL on the surface of the lead LD), and the contact resistance between the lead LD and the socket terminal ST can be further reduced.

Further, it is preferable that the slit SL does not reach the center of the plate-shaped portion P3 in the X direction. Consequently, a mechanical strength of the plate-shaped portion P3 can be secured to some extent, so that a reduction in the life-span of the socket terminal ST due to providing the slit SL can be more accurately prevented.

Further, in the present embodiment, as described above, the contact portions S1, S2 of the socket terminal ST are brought into contact with the external terminal of the semiconductor device PKG to perform the electrical test of the semiconductor device PKG, so that the local temperature rise that may occur at the connecting point between the terminal ST and the external terminal of the semiconductor device PKG can be suppressed and that the defect caused by the temperature rise can be suppressed or prevented. Consequently, in a case of performing such an electrical test that a large current (for example, a current of 1 ampere or more) is supplied to the semiconductor device PKG via the socket terminal ST in the test step, applying the present embodiment brings extremely large effects thereof.

The semiconductor device PKG is, for example, a semiconductor device for switching, and includes a semiconductor chip (here, semiconductor chips CPH, CPL) on which a power MOSFET is formed. In such a semiconductor device, a large current flows during actual use. Specifically, the large current flows between a pad PDSH for the source and a back electrode BEH for the drain of the semiconductor chip CPH, and the large current flows between a pad PDSL for the source and a back electrode BEL for the drain of the semiconductor chip CPL. In the semiconductor device PKG, the large current flows between a lead LDSH and a lead LDDH through the power MOSFET formed in the semiconductor chip CPH, and the large current flows between a lead LDSL and a lead LDDL through the power MOSFET formed in the semiconductor chip CPL. Consequently, in the test step of such a semiconductor device PKG, it is desirable to perform such an electrical test that the large current is supplied to the semiconductor device PKG through the socket terminal ST. For example, performed is such an electric test that the large current flows between the lead LDSH and the lead LDDH through the power MOSFET formed in the semiconductor chip CPH, or the large current flows between the lead LDSL and the lead LDDL through the power MOSFET formed in the semiconductor chip CPL. In that case, the large current leads to flowing through the socket terminal ST connected to any of the leads LDSH, LDDH, LDSL, and LDDL. However, even in such a case, in the present embodiment, as described above, the local temperature rise that may occur at the connecting point between the socket terminal ST and the lead LD of the semiconductor device PKG can be suppressed or prevented, and the defect caused by the temperature rise can be suppressed or prevented. Consequently, if the present embodiment is applied in a case in which the semiconductor device for switching, for example, the semiconductor device constituting an inverter is used as the semiconductor device PKG to be inspected, the effect thereof is extremely large.

Modification Example

Figure 22:
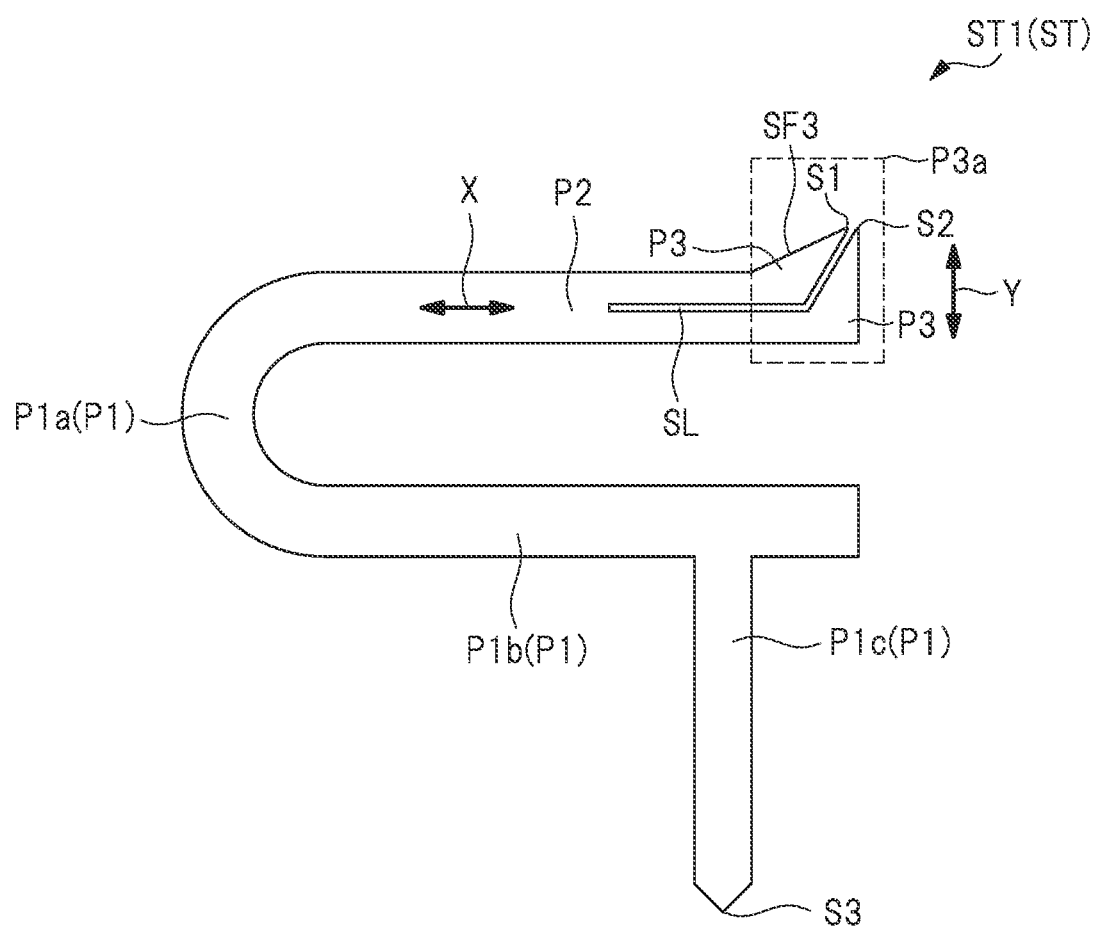
FIG. 22 is a side view showing a modification example of the socket terminal of FIG. 10.

Next, a first modification example of the present embodiment will be described. FIG. 22 is a side view (plan view) showing a first modification example of the socket terminal ST, and corresponds to FIG. 10. A socket terminal ST of a first modification example shown in FIG. 22 is denoted by the reference numeral ST1 and is referred to as a socket terminal ST1.

The socket terminal ST1 of the first modification example shown in FIG. 22 is different from the socket terminal ST shown in FIGS. 10 to 15 in the following points.

That is, in the socket terminal ST shown in FIGS. 10 to 15, the entire tip portion P3 of the socket terminal ST protrudes so as to approach the lead LD of the semiconductor device PKG (accordingly, in the Y direction). Meanwhile, in the socket terminal ST1 of the first modification example shown in FIG. 22, the tip portion P3 of the socket terminal ST protrudes so as to gradually approach the lead LD of the semiconductor device PKG (accordingly, in the Y direction) as it moves away from the plate-shaped portion P2. For this reason, regarding a degree to which the tip portion P3 protrudes in the Y direction, the socket terminal ST1 of the first modification example shown in FIG. 22 is smaller than the socket terminal ST shown in FIGS. 10 to 15.

Incidentally, in the case of the socket terminal ST1 of the first modification example shown in FIG. 22, the tip portion P3 corresponds to an area surrounded by a dotted line and denoted by the reference numeral P3a out of the socket terminal ST1.

Also in the case of the socket terminal ST1 of the first modification example shown in FIG. 22, the slit SL as described in relation to the socket terminal ST shown in FIGS. 10 to 15 is formed. Then, in the test step, the tip portion P3 of the socket terminal ST1 and the lead LD of the semiconductor device PKG are opposed to each other in the Y direction, and the contact portions S1, S2 of the socket terminal ST1 electrically contact the lead LD of the semiconductor device PKG. Consequently, the above-mentioned effect can be obtained also in the case of the socket terminal ST1 of the first modification example.

Figure 23:
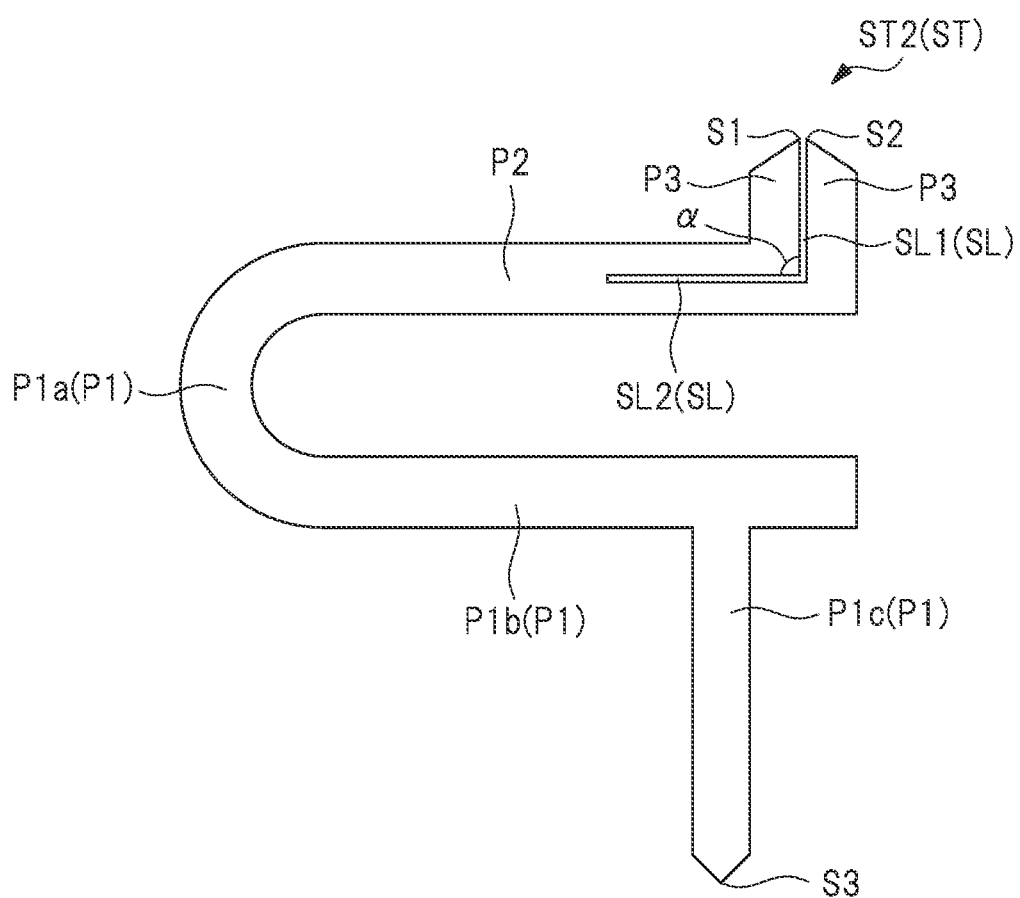
FIG. 23 is a side view showing another modification example of the socket terminal of FIG. 10.

Next, a second modification example of the present embodiment will be described. FIG. 23 is a side view (plan view) showing a second modification example of the socket terminal ST, and corresponds to FIG. 10. The socket terminal ST of a second modification example shown in FIG. 23 is denoted by the reference numeral ST2 and is referred to as a socket terminal ST2.

The socket terminal ST2 of the second modification example shown in FIG. 23 is different from the socket terminal ST shown in FIGS. 10 to 15 in the following points.

That is, in the socket terminal ST shown in FIGS. 10 to 15, an angle $\alpha$ formed by the slit portion SL1 and the slit portion SL2 is larger than 90° ($\alpha$>90°). Then, the slit portion SL1 reaches the outer periphery of the tip portion P3 at the corner portion of the tip portion P3 of the socket terminal ST. Meanwhile, in the socket terminal ST2 of the second modification example shown in FIG. 23, the angle $\alpha$ formed by the slit portion SL1 and the slit portion SL2 is 90° ($\alpha$=90°). That is, the slit portion SL1 extends in a direction substantially perpendicular to the slit portion SL2.

In the case of the socket terminal ST2 of the second modification example shown in FIG. 23, it is easy to make a shape of the socket terminal ST2 near the contact portion S1 and a shape near the contact portion S2 the same. For this reason, it becomes easy to make a state where the contact portion S1 of the socket terminal ST2 and the external terminal of the semiconductor device PKG contact with each other and a state where the contact portion S2 of the socket terminal ST2 and the external terminal of the semiconductor device PKG contact with each other the same. This makes it easier to stabilize a contacting state between the contact portions S1, S2 of the socket terminal ST2 and the external terminal of the semiconductor device PKG.

Meanwhile, in the case of the socket terminal ST shown in FIGS. 10 to 15, it becomes easy to form the contact portions S1, S2 of the socket terminal ST for being caused to contact with the external terminal of the semiconductor device PKG, and to manufacture the socket terminal ST.

Second Embodiment

Figure 24:
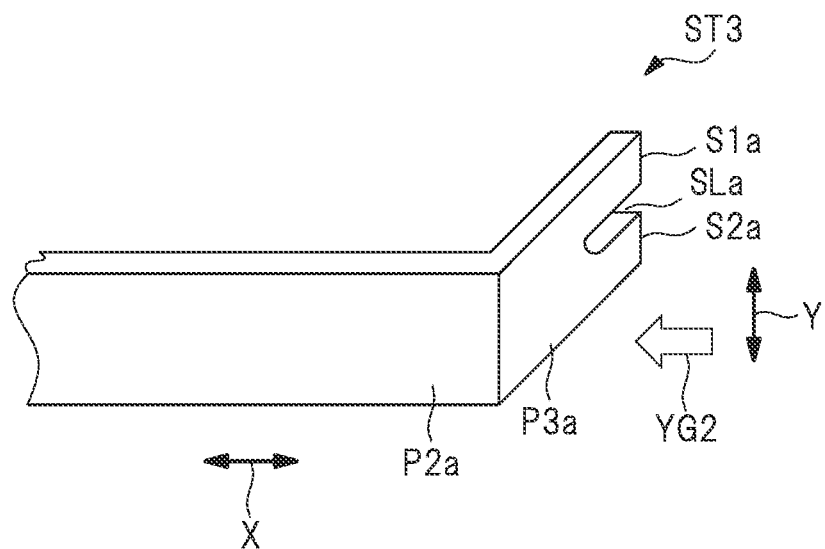
FIG. 24 is an explanatory diagram of a socket terminal of another present embodiment.
Figure 25:
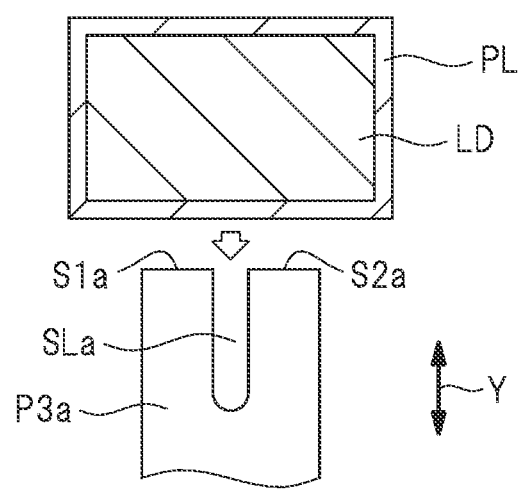
FIG. 25 is an explanatory diagram of a socket terminals of another present embodiment.

FIGS. 24 and 25 are explanatory diagrams of a socket terminal ST3 of a second embodiment. FIG. 24 corresponds to a perspective view, and FIG. 25 shows a front surface of the socket terminal ST3 and a cross-section of the lead LD when the socket terminal ST3 is viewed from a direction of an arrow YG2 shown in FIG. 24. In FIG. 25, a direction substantially perpendicular to a paper face corresponds to the X direction.

The socket terminal ST3 of the second embodiment corresponds to the socket terminal ST of the first embodiment.

In the first embodiment, the thickness direction of the socket terminal ST has been a direction substantially perpendicular to the X direction (extending direction of the plate-shaped portion P2) and the Y direction (direction in which the tip portion P3 and the external terminal of the semiconductor device PKG are opposed to each other). That is, the thickness direction of the socket terminal ST has been the horizontal direction (a direction substantially perpendicular to the up-and-down direction). For this reason, in the test step, the width direction of the lead LD of the semiconductor device PKG and the thickness direction of the socket terminal ST caused to contact with the lead LD have been almost the same.

Meanwhile, a thickness direction of the socket terminal ST3 in the second embodiment is different from the thickness direction of the socket terminal ST in the first embodiment. In the second embodiment, a thickness direction of the plate-shaped portion P2a of the socket terminal ST3 is a direction substantially parallel to the Y direction (a direction in which the tip portion P3a and the external terminal of the semiconductor device PKG are opposed to each other). Specifically, the Y direction corresponds to the up-and-down direction. A width direction of the socket terminal ST3 is a direction substantially perpendicular to the X direction and the Y direction.

The socket terminal ST3 in the second embodiment has a plate-shaped portion P2a integrally connected to the curved support portion (corresponding to the above-mentioned support portion P1a, but not shown in FIG. 24), and a tip portion P3a integrally connected to the plate-shaped portion P2a. The plate-shaped portion P2a extends in the X direction, and the tip portion P3a extends in a direction (a direction inclined on a side approaching the lead LD) inclined with respect to the extending direction (X direction) of the plate-shaped portion P2a. A slit SLa is formed at the tip portion P3a of the socket terminal ST3. The slit SLa is formed along the extending direction of the socket terminal ST3. The slit SLa reaches the outer periphery of the tip portion P3a and is opened at an end side (an end side opposite to a side connected to the plate-shaped portion P2a) of the tip portion P3a of the socket terminal ST3. The tip portion P3a of the socket terminal ST3 has a contact portion S1a and a contact portion S2a separated from each other by way of the slit SLa. In the test step, the tip portion P3a of the socket terminal ST3 and the lead LD of the semiconductor device PKG are opposed to each other in the Y direction, and the contact portions S1a, S2a of the socket terminal ST3 electrically contact with the lead LD of the semiconductor device PKG.

Also in the second embodiment, the contact portion S1a and the contact portion S2a of the socket terminal ST3 separated from each other by way of the slit SL are displaceable independently in the Y direction by providing the slit SLa at the tip portion P3a of the socket terminal ST3. For this reason, both the contact portion S1a and the contact portion S2a of the socket terminal ST3 can be caused to reliably contact with the external terminal of the semiconductor device PKG. This makes it possible to suppress the local temperature rise that may occur at the connecting point between the socket terminal ST3 and the external terminal of the semiconductor device PKG in the test step, and to suppress or prevent the defect caused by the temperature rise.

Figure 26:
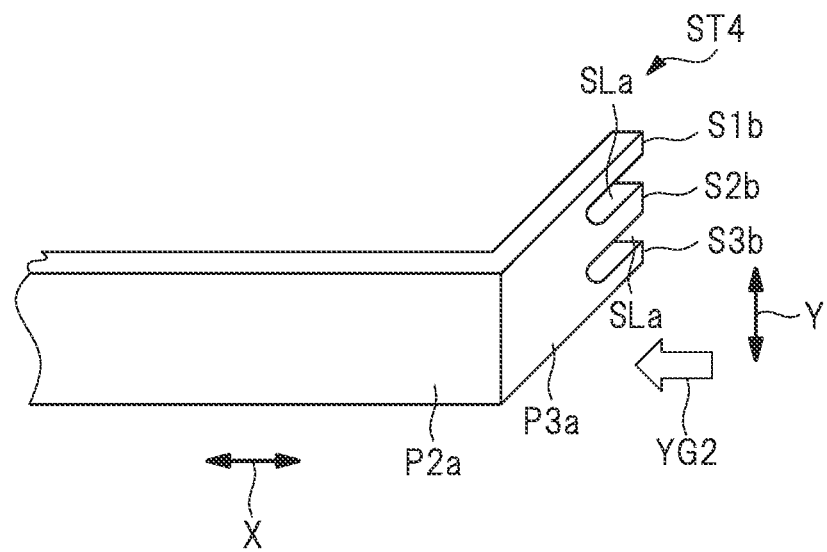
FIG. 26 is an explanatory diagram showing each modification example of the socket terminals of FIGS. 24 and 25.
Figure 27:
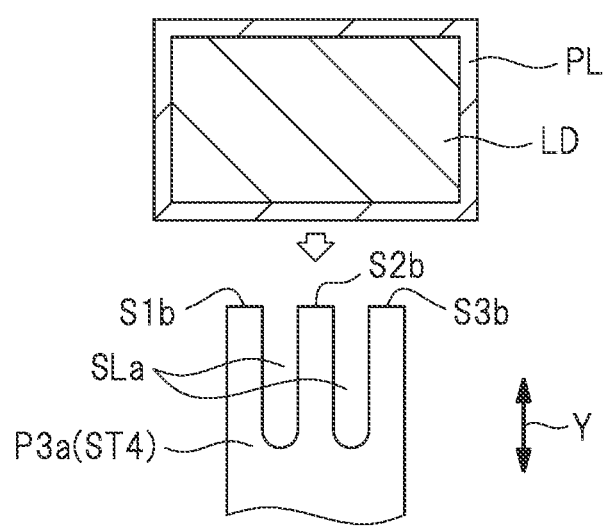
FIG. 27 is an explanatory diagram showing each modification example of the socket terminals of FIGS. 24 and 25.

FIGS. 26 and 27 are explanatory diagrams of a modification example of the socket terminal ST3 of the second embodiment. FIG. 26 corresponds to FIG. 24, and FIG. 27 corresponds to FIG. 25.

In the cases of FIGS. 24 and 25, the number of slits SLa formed in the tip portion P3a of the socket terminal ST3 has been one. Meanwhile, in cases of FIGS. 26 and 27, the number of slits SLa formed in the tip portion P3a of the socket terminal ST3 is two. The two slits SLa are separated from each other in the width direction of the socket terminal ST3. For this reason, in the cases of FIGS. 26 and 27, the tip portion P3a of the socket terminal ST3 has three contact portions S1b, S2b, S3b separated from one another via the slit S1a and, in the test step, the contact portions S1b, S2b, S3b of the socket terminal ST3 electrically contact with the lead LD of the semiconductor device PKG.

Also in the cases of FIGS. 26 and 27, since the slit SLa is provided at the tip portion P3a of the socket terminal ST3, the contact portions S1b, S2b, S3b of the socket terminal ST3 separated from one another via the slit SL are displaceable independently in the Y direction. For this reason, the contact portions S1b, S2b, S3b of the socket terminal ST3 can be caused to reliably contact with the external terminal of the semiconductor device PKG. This makes it possible to suppress the local temperature rise that may occur at the connecting point between the socket terminal ST3 and the external terminal of the semiconductor device PKG in the test step, and to suppress or prevent the defect caused by the temperature rise.

As a further modification example of the second embodiment, the number of slits SLa formed in the tip portion P3a of the socket terminal ST3 may be three or more.

Although the invention made by the present inventor (s) has been specifically described above based on the embodiments thereof, the present invention is not limited to the above-mentioned embodiments and, needless to say, can be variously modified within a range not departing from the scope thereof.

For example, in the first and second embodiments described above, a case where the lead is applied as the external terminal of the semiconductor device that is caused to contact the socket terminal has been described as an example. As another form, a member other than the lead, for example, a ball electrode (bump electrode) such as a solder ball (solder bump) can be applied as the external terminal of the semiconductor device which is caused to contact with the socket terminal. Therefore, the semiconductor device to be inspected may be a BGA (Ball Grid Array) type semiconductor package or the like.

What is claimed is:

1. A method of manufacturing a semiconductor device, comprising:
   (a) preparing a test device having an inspection terminal;
   (b) preparing a semiconductor package having an external terminal; and
   (c) after the (a) and the (b), bringing the inspection terminal into contact with the external terminal of the semiconductor package, and performing an electrical test of the semiconductor package,
   wherein the inspection terminal has:
      a main body portion including a support portion that is curved;
      a plate-shaped portion integrally connected to the support portion and extending in a first direction;
      a tip portion integrally connected to the plate-shaped portion, a dimension of the tip portion in a second direction intersecting with the first direction being larger than a dimension of the plate-shaped portion in the second direction; and
      a slit formed from the tip portion to the plate-shaped portion so as not to reach the support portion,
   wherein the tip portion has a first contact portion and a second contact portion that are separated from each other by way of the slit,
   wherein, in the (c), after arranging each of the inspection terminal and the semiconductor package such that the tip portion of the inspection terminal and the external terminal of the semiconductor package are opposed to each other in the second direction, each of the first contact portion and the second contact portion is brought into contact with the external terminal, wherein the slit has s first slit portion and a second slit portion connecting to the first slit portion, wherein the first slit portion extends in a third direction intersecting with the first direction, and is formed at the tip portion so as to reach an outer periphery of the tip portion, and wherein the second slit portion extends along the first direction and is terminated in a middle of the plate-shaped portion.

2. The method according to claim 1, wherein an angle formed by the first slit portion and the second slit portion is larger than 90°.

3. The method according to claim 1,
wherein the first slit portion reaches the outer periphery of the tip portion at a corner portion of the tip portion.

4. The method according to claim 3,
wherein the first contact portion and the second contact portion are adjacent to each other at the corner portion of the tip portion so as to sandwich the second slit portion therebetween.

5. The method according to claim 3,
wherein the tip portion of the inspection terminal has a third surface opposing the external terminal of the semiconductor package in the (c), and
wherein the third surface is inclined with respect to the first direction.

6. The method of according to claim 1, wherein an angle formed by the first slit portion and the second slit portion is 90°.

7. The method according to claim 1, wherein the second slit portion is located at a center of the plate-shaped portion of the inspection terminal in the second direction.

8. The method according to claim 1, wherein the tip portion connected to the plate-shaped portion protrudes toward a side of the external terminal in the second direction.

9. The method according to claim 1, wherein the slit does not reach a center of the plate-shaped portion in the first direction.

10. The method according to claim 1, wherein a relative position between the first contact portion and the second contact portion of the inspection terminal in the second direction is displaceable.

11. The method according to claim 1,
wherein each of the plate-shaped portion and the tip portion has a first surface parallel to the first direction and the second direction, and a second surface opposite to the first surface, and
wherein the slit is formed so as to penetrate between the first surface and the second surface.

12. The method of according to claim 1,
wherein the semiconductor package has a semiconductor chip electrically connected to the external terminal, and
wherein, in the (c), a current is supplied to the semiconductor chip via the inspection terminal and the external terminal.

13. The method according to claim 1,
wherein the semiconductor package has a plurality of external terminals each composed of the external terminal,
wherein the test device has a plurality of inspection terminals each composed of the inspection terminal, and
wherein, in the (c), the plurality of external terminals of the semiconductor package is brought into contact with the plurality of inspection terminals, and an electrical test of the semiconductor package is performed.

14. The method according to claim 1, wherein a plating layer made of a solder material is formed on a surface of the external terminal.

* * * * *